(12) United States Patent
Dunn et al.

(10) Patent No.: US 8,647,817 B2
(45) Date of Patent: Feb. 11, 2014

(54) VAPOR TREATMENT PROCESS FOR PATTERN SMOOTHING AND INLINE CRITICAL DIMENSION SLIMMING

(75) Inventors: Shannon W. Dunn, Altamont, NY (US); Dave Hetzer, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/342,313

(22) Filed: Jan. 3, 2012

(65) Prior Publication Data

US 2013/0171571 A1 Jul. 4, 2013

(51) Int. Cl.
*G03F 7/26* (2006.01)

(52) U.S. Cl.
USPC .......................................... 430/324; 430/322

(58) Field of Classification Search
USPC .................... 430/322, 324, 328, 330
See application file for complete search history.

(56) References Cited

U.S. PATENT DOCUMENTS

| | | |
|---|---|---|
| 6,582,891 B1 | 6/2003 | Hallock |
| 6,709,807 B2 | 3/2004 | Hallock |
| 7,135,419 B2 | 11/2006 | Chandhok et al. |
| 7,405,032 B1 | 7/2008 | Amblard et al. |
| 7,733,502 B2 | 6/2010 | Moriya et al. |
| 2003/0049571 A1 | 3/2003 | Hallock |
| 2005/0173838 A1 | 8/2005 | Priedeman |
| 2009/0108486 A1 | 4/2009 | Babin |
| 2009/0151631 A1 | 6/2009 | Minamida |
| 2009/0155731 A1 | 6/2009 | Urakwawa |
| 2009/0214985 A1 | 8/2009 | Kulp |
| 2010/0291490 A1 | 11/2010 | Tsuruda et al. |
| 2011/0014790 A1 | 1/2011 | Kim |
| 2011/0070545 A1 | 3/2011 | Dunn et al. |
| 2011/0111596 A1 | 5/2011 | Kanakasabapathy |
| 2011/0244402 A1 | 10/2011 | Carcasi et al. |
| 2011/0244403 A1 | 10/2011 | Carcasi et al. |

OTHER PUBLICATIONS

International Search Report for PCT/US 12/69082, TTCA-368, International Searching Authority, USPTO, Alexandria, Virginia, Feb. 25, 2013.

*Primary Examiner* — Kathleen Duda
(74) *Attorney, Agent, or Firm* — Wood, Herron & Evans, LLP

(57) ABSTRACT

A method for patterning a substrate is described. The method includes forming a layer of radiation-sensitive material on a substrate, and preparing a pattern in the layer of radiation-sensitive material using a lithographic process, wherein the pattern is characterized by a critical dimension (CD) and a roughness. Following the preparation of the pattern in the layer of radiation-sensitive material, the method further includes performing a CD slimming process to reduce the CD to a reduced CD, and performing a vapor smoothing process to reduce the roughness to a reduced roughness.

20 Claims, 20 Drawing Sheets

VAPOR TREATMENT PROCESS FOR PATTERN SMOOTHING AND INLINE CRITICAL DIMENSION SLIMMING

CROSS-REFERENCE TO RELATED APPLICATIONS

This application is related to pending U.S. patent application Ser. No. 13/158,868, entitled "DOUBLE PATTERNING WITH INLINE CRITICAL DIMENSION SLIMMING", filed on Jun. 13, 2011; and pending U.S. patent application Ser. No. 13/158,899, entitled "SIDEWALL IMAGE TRANSFER PITCH DOUBLING AND INLINE CRITICAL DIMENSION SLIMMING", filed on Jun. 13, 2011. The entire content of these applications are herein incorporated by reference in their entirety.

BACKGROUND OF THE INVENTION

1. Field of Invention

The invention relates to a method for patterning a thin film on a substrate, and more particularly to a method for reducing roughness of the pattern.

2. Description of Related Art

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution.

As the critical dimension (CD) decreases and the aspect ratio of the patterns formed in a layer of radiation-sensitive material increases, the potential for pattern defects including, but not limited to, pattern collapse, line edge roughness (LER), and line width roughness (LWR), becomes increasingly enhanced. In most situations, excessive pattern defects are unacceptable and, in some instances, catastrophic.

SUMMARY OF THE INVENTION

The invention relates to a method for patterning a thin film on a substrate. The invention also relates to a method for patterning a thin film on a substrate and reducing roughness of the pattern. The invention further relates to a method for reducing a critical dimension (CD) of a pattern formed in a thin film on a substrate using a CD slimming process. Further yet, the invention relates to a method for reducing roughness of a pattern formed in a thin film on a substrate using a smoothing process, such as a vapor smoothing process.

According to one embodiment, a method for patterning a substrate is described. The method includes forming a layer of radiation-sensitive material on a substrate, and preparing a pattern in the layer of radiation-sensitive material using a lithographic process, wherein the pattern is characterized by a critical dimension (CD) and a roughness. Following the preparation of the pattern in the layer of radiation-sensitive material, the method further includes performing a CD slimming process to reduce the CD to a reduced CD, and performing a smoothing process to reduce the roughness to a reduced roughness.

DETAILED DESCRIPTION OF SEVERAL EMBODIMENTS

Figure 1A:
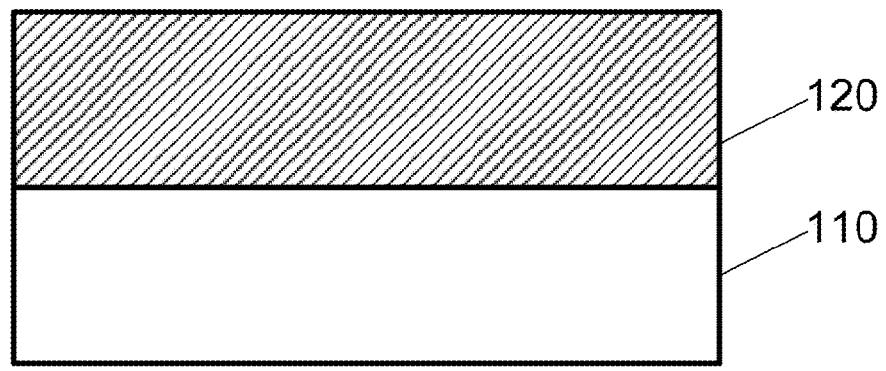
FIGS. 1A through 1C present a simplified schematic representation of a method of patterning a substrate according to an embodiment.

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Referring now to the drawings, wherein like reference numerals designate identical or corresponding parts throughout the several views, FIGS. 1A through 1C, and FIG. 2 illustrate a method for patterning a substrate according to an embodiment. The method is illustrated in a flow chart 200, and begins in 210 with forming a layer of radiation-sensitive material 120 on a substrate 110. The layer of radiation-sensitive material 120 may include a photo-resist. For example, the layer of radiation-sensitive material 120 may comprise a 248 nm (nanometer) resist, a 193 nm resist, a 157 nm resist, an EUV (extreme ultraviolet) resist, or an electron beam sensitive resist. Furthermore, for example, the first layer of radiation-sensitive material 120 may comprise a thermal freeze photo-resist, an electromagnetic (EM) radiation freeze photo-resist, or a chemical freeze photo-resist.

The layer of radiation-sensitive material 120 may be formed by spin-coating the material onto substrate 110. The first layer of radiation-sensitive material 120 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 110 and one or more cooling cycles, following the one or more first PABs, to cool the substrate 110.

Figure 1B:
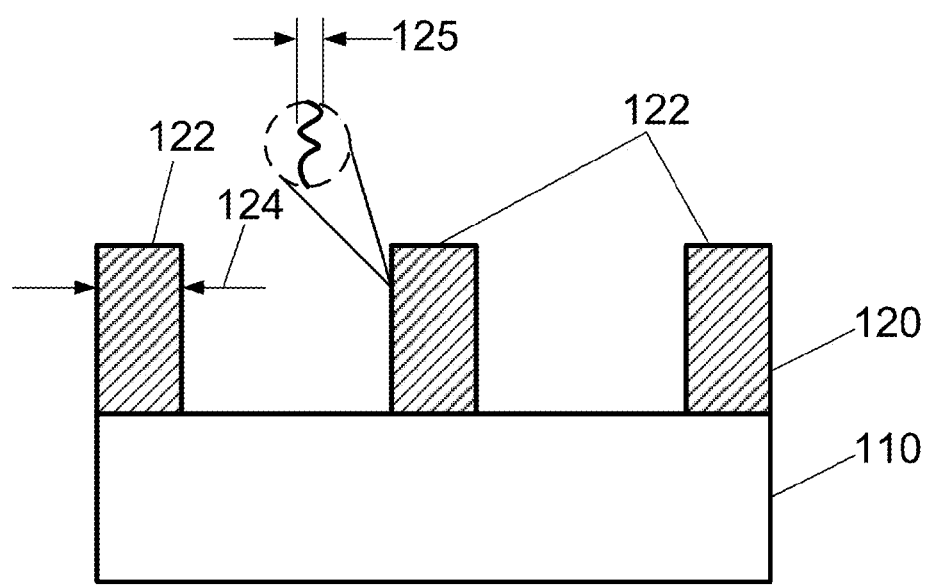

In 220 and as shown in FIG. 1B, a pattern 122 is prepared in the layer of radiation-sensitive material 120. The substrate 110 having the layer of radiation-sensitive material 120 is aligned at an alignment position in a radiation exposure system and imaged with radiation having an image pattern. The radiation exposure system may include a dry or wet photo-lithography system. The image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the image pattern may be formed using an electron beam lithography system.

The layer of radiation-sensitive material 120, having been exposed to the image pattern, is subjected to a developing process in order to remove the image pattern region, and form pattern 122 in the layer of radiation-sensitive material 120. The pattern 122 may be characterized by a critical dimension (CD) 124 and a roughness 125. The roughness 125 may include a line edge roughness (LER), or a line width roughness (LWR), or both LER and LWR. The pattern 122 may include a line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more first post-exposure bakes (PEB) to heat the substrate 110 and one or more cooling cycles, following the one or more first PEBs, to cool the substrate 110.

Figure 1C:
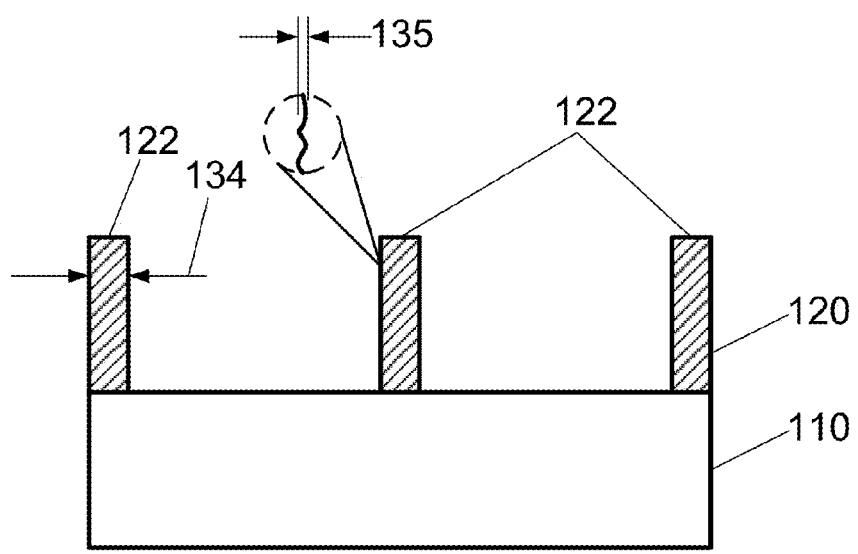
Figure 2:
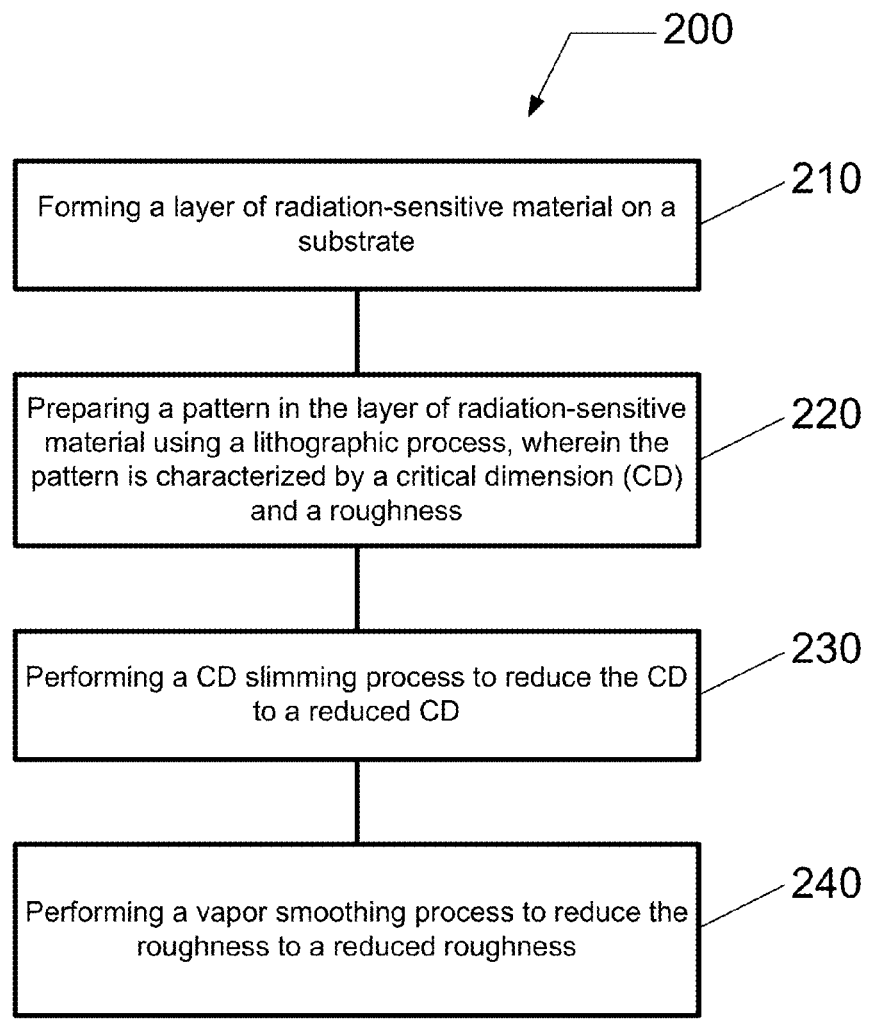
FIG. 2 provides a flow chart illustrating a method of patterning a substrate according to another embodiment.
Figure 3:
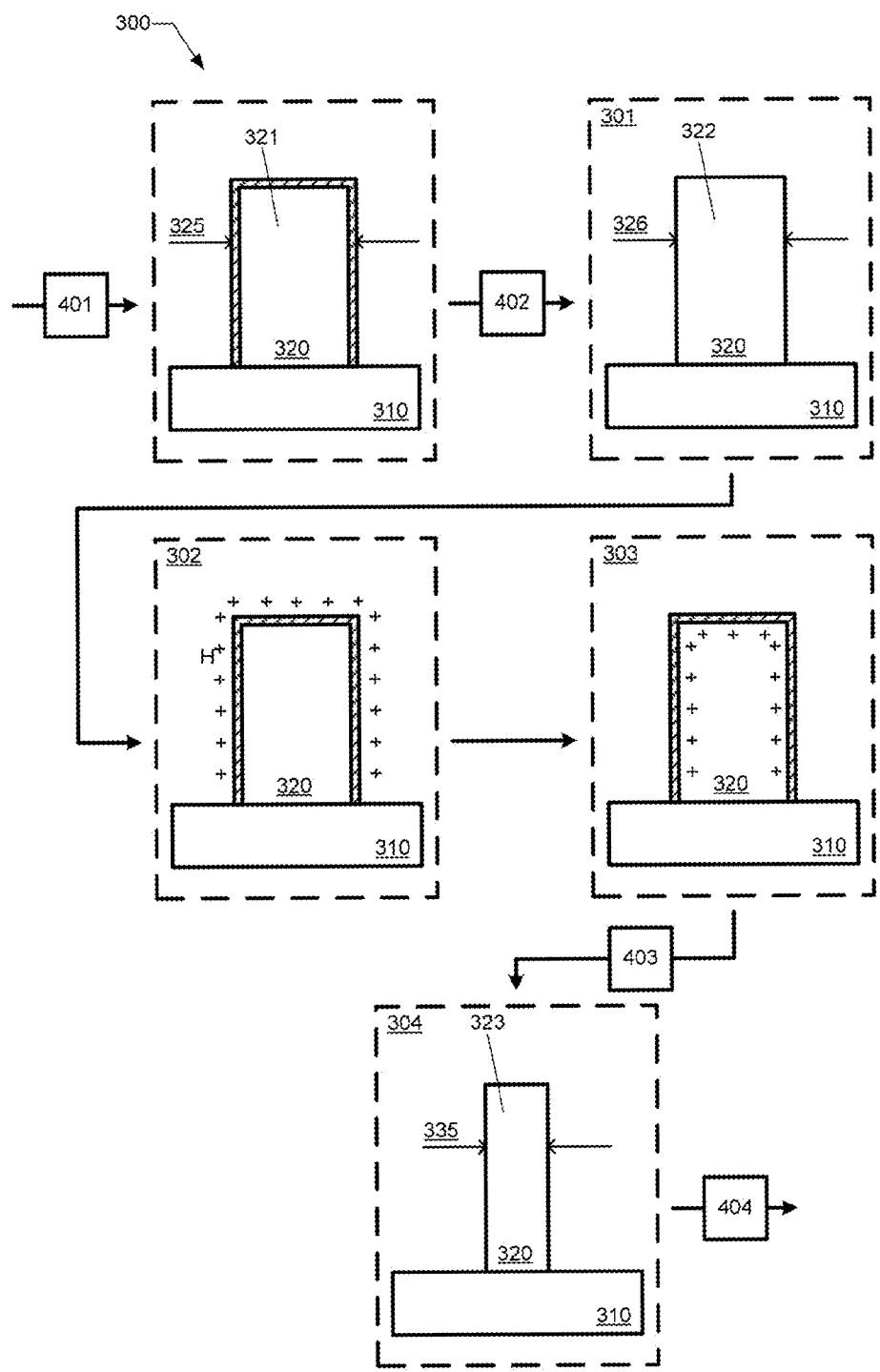
FIG. 3 presents a simplified schematic representation of a method for performing a CD slimming process according to another embodiment.
Figure 9A:
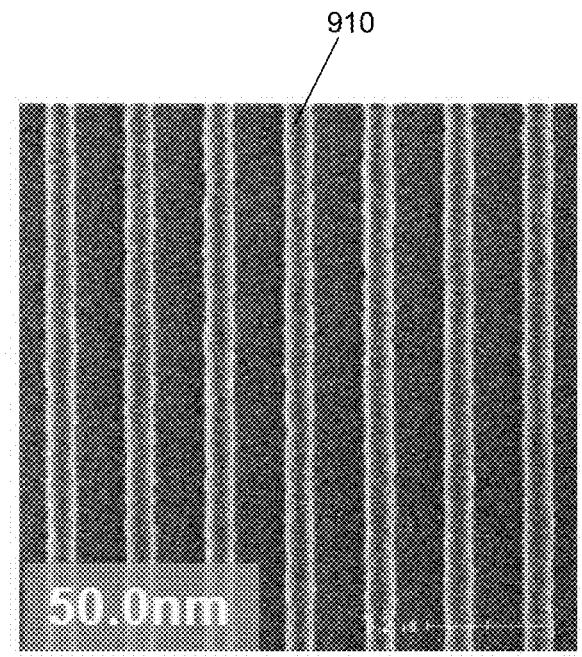
FIGS. 9A and 9B provide exemplary data for performing a CD slimming process.
Figure 9B:
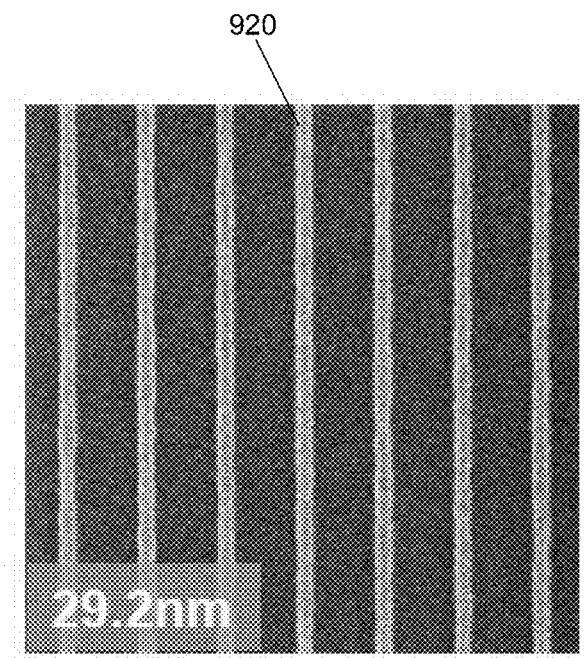

In 230 and as shown in FIG. 1C, following the preparation of pattern 122 in the layer of radiation-sensitive material 120, a critical dimension (CD) slimming process is performed to reduce the CD 124 to a reduced CD 134. FIG. 3 illustrates a CD slimming process, and FIGS. 9A and 9B provide exemplary data for the CD slimming process.

Figure 10A:
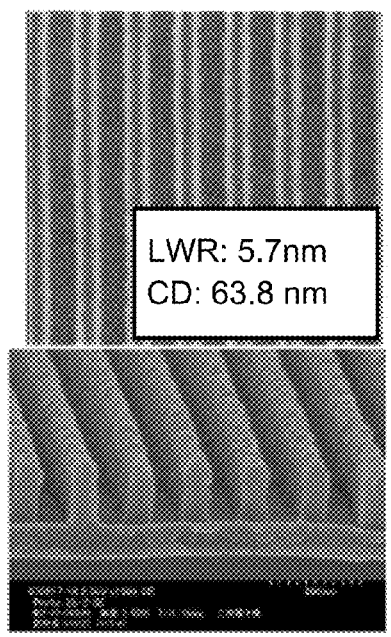
FIGS. 10A and 10B provide exemplary data for performing a vapor smoothing process.
Figure 10B:
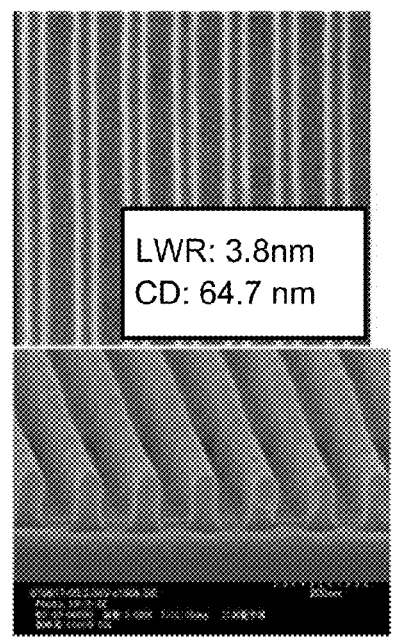

In 240 and as also shown in FIG. 1C, following the preparation of pattern 122 in the layer of radiation-sensitive material 120, a smoothing process is performed to reduce the roughness 125 to a reduced roughness 135. FIGS. 4A through 4E illustrate a smoothing process, such as a vapor smoothing process, and FIGS. 10A and 10B provide exemplary data for the vapor smoothing process.

As noted above, the smoothing process may include a vapor (vapor-phase) smoothing process. However, it may also include a liquid (liquid-phase) smoothing process, or a combination of vapor and liquid smoothing processes. The liquid smoothing process may include performing one or more surfactant-containing rinse processes, for example. Additional details for a surfactant-containing rinse process for reducing roughness may be found in U.S. patent application Ser. No. 13/206,441, entitled "Multiple Chemical Treatment Process for Reducing Pattern Defect" and filed on Aug. 9, 2011.

The smoothing process may additionally include thermal treatment, e.g., elevation of the substrate temperature. The smoothing process may further include exposure to electromagnetic (EM) radiation, such as ultraviolet (UV) radiation, microwave radiation, or electron beam radiation.

As illustrated pictorially in FIG. 3, the CD slimming process comprises a process sequence 300 beginning with receiving a substrate 310 having a layer of radiation-sensitive material 320 formed thereon within which pattern 321 is prepared. As described above, following the exposure of the layer of radiation-sensitive material 320 to electromagnetic (EM) radiation in the photo-lithography system, the layer of radiation-sensitive material 320 is developed by exposing the layer of radiation-sensitive material 320 to a first developing solution, thus, leaving behind pattern 321 having CD 325. During the exposure of the layer of radiation-sensitive material 320 to EM radiation, a (cross-hatched) portion of the pattern 321 is exposed to EM radiation of intermediate intensity, yet remains following exposure to the first developing solution.

In 301, the layer of radiation-sensitive material 320 is developed further by exposing the layer of radiation-sensitive material 320 to a second developing solution at an elevated temperature. In doing so, the second developing solution at the elevated temperature removes the (cross-hatched) portion of the pattern 321 that is exposed to EM radiation of intermediate intensity leaving behind an intermediate pattern 322 with an intermediate reduced CD 326. As an example, the second developing solution may include a TMAH-containing solution elevated to a hot develop temperature greater than or equal to about 23 degrees C. Alternatively, as an example, the second developing solution may include a TMAH-containing solution elevated to a hot develop temperature greater than or equal to about 25 degrees C. Alternatively, as an example, the second developing solution may include a TMAH-containing solution elevated to a hot develop temperature greater than or equal to about 30 degrees C. Alternatively, as an example, the second developing solution may include a TMAH-containing solution elevated to a hot develop temperature greater than or equal to about 23 degrees C. and less than or equal to about 50 degrees C. Alternatively yet, as an example, the second developing solution may include a TMAH-containing solution elevated to a hot develop temperature greater than or equal to about 30 degrees C. and less than or equal to about 50 degrees C. In this process step, the concentration of the developing solution, the temperature, and the time for exposure are process parameters that may be adjusted to achieve pattern CD control.

In 302, the intermediate pattern 322 with intermediate reduced CD 326 is treated with an acid (represented with "+" signs, and/or $H^+$) solution. As an example, an acid-containing solution may be applied to the layer of radiation-sensitive material 320 with intermediate reduced CD 326 via spin-coating, as described above. In this process step, the concentration of the acid-containing solution, the temperature, and the time for exposure are process parameters that may be adjusted to achieve pattern CD control.

In 303, the layer of radiation-sensitive material 320 is elevated in temperature to diffuse the acid into the pattern in the layer of radiation-sensitive material 320. As an example, the layer of radiation-sensitive material 320 is elevated to a bake temperature greater than or equal to about 50 degrees C. Alternatively, as an example, the layer of radiation-sensitive material 320 is elevated to a bake temperature ranging from about 50 degrees C. to about 180 degrees C. In this process step, the temperature and the time for exposure are process parameters that may be adjusted to achieve pattern CD control.

In 304, the layer of radiation-sensitive material 320 is developed further yet by exposing the layer of radiation-sensitive material 320 to a third developing solution. In doing so, the third developing solution produces a final pattern 323 in the layer of radiation-sensitive material 320 with a reduced CD 335. As an example, the third developing solution may include a TMAH-containing solution at room temperature. In this process step, the concentration of the developing solution, the temperature, and the time for exposure are process parameters that may be adjusted to achieve pattern CD control.

Additional details for a CD slimming process may be found in U.S. Patent Application Publication Serial No. 2010/0291490A1, entitled "Resist Pattern Slimming Treatment Method". Other details for a CD slimming process may be found in U.S. patent application Ser. No. 12/751,362, entitled "Method of Slimming Radiation-Sensitive Material Lines in Lithographic Applications", filed on Mar. 31, 2010, and published as U.S. Patent Application Publication No. 2011/0244402, or U.S. patent application Ser. No. 13/077,833, entitled "Method of Slimming Radiation-Sensitive Material Lines in Lithographic Applications", filed on Mar. 31, 2011, and published as U.S. Patent Application Publication No. 2011/0244403.

As shown in FIGS. 9A and 9B, a CD slimming process is performed to reduce a first line CD 910 of about 50 nm (nanometers) to a second line CD 920 of about 29.2 nm.

Figure 4A:
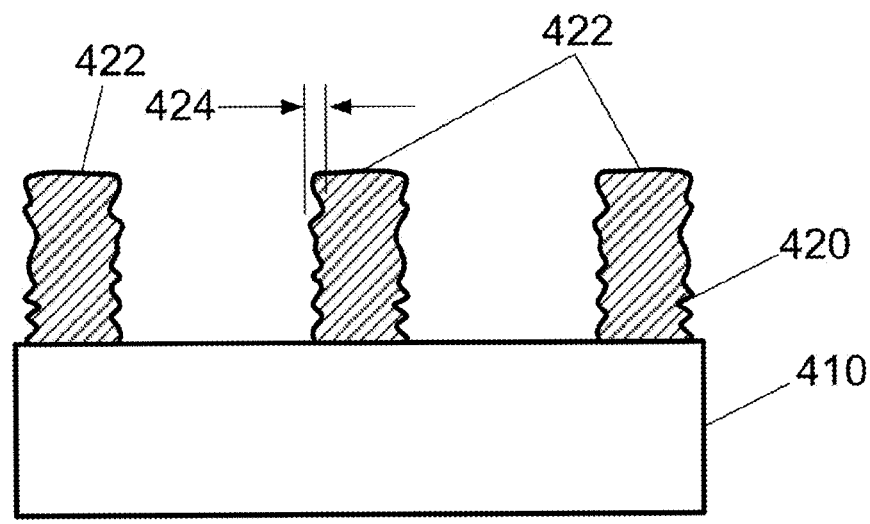
FIG. 4A through 4E present a simplified schematic representation of a method for performing a vapor smoothing process according to another embodiment.

As illustrated pictorially in FIGS. 4A through 4E, the smoothing process comprises a process sequence beginning with receiving a substrate 410 having a layer of radiation-sensitive material 420 formed thereon within which pattern 422 is prepared (see FIG. 4A). As described above, following the exposure of the layer of radiation-sensitive material 420 to electromagnetic (EM) radiation in the photo-lithography system, the layer of radiation-sensitive material 420 is developed by exposing the layer of radiation-sensitive material 420 to a developing solution, thus, leaving behind a pattern 422 having roughness 424.

Figure 4B:
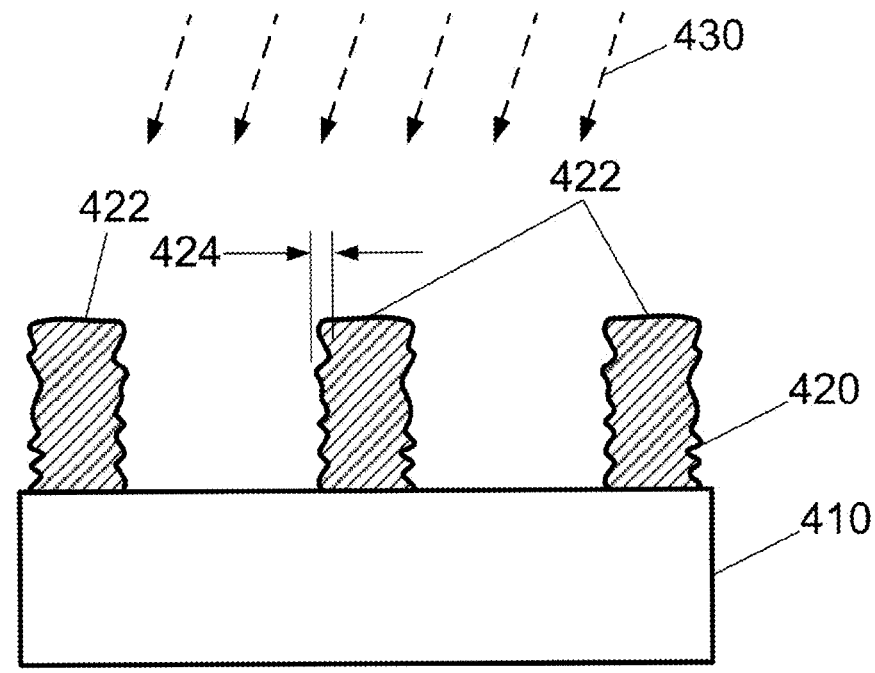

As described above, the smoothing process may include a vapor-phase smoothing process. Therein, as shown in FIG. 4B, the pattern 422 in the layer of radiation-sensitive material 420 is exposed to a vapor-phase environment 430. In one embodiment, the vapor-phase environment 430 may include a treatment vapor containing N-Methylpyrrolidone or N-Methyl-2-pyrrolidone. For example, substrate 410 may be exposed to an atomized spray of a treatment solution. Additionally, the substrate may be heated to elevate the temperature of the substrate during the exposing of pattern 422 on substrate 410 to the treatment vapor. The temperature of the substrate may range from about 20 degrees C. to about 100 degrees C., and may preferably range from about 30 degrees C. to about 50 degrees C. Furthermore, the substrate may be irradiated with electromagnetic (EM) radiation during the exposing of pattern 422 on substrate 410 to the treatment vapor. In this process step, the concentration of the treatment solution, the temperature of the substrate, the pressure for the vapor-phase environment 430, and the time for exposure are process parameters that may be adjusted to achieve roughness reduction or control.

Figure 4C:
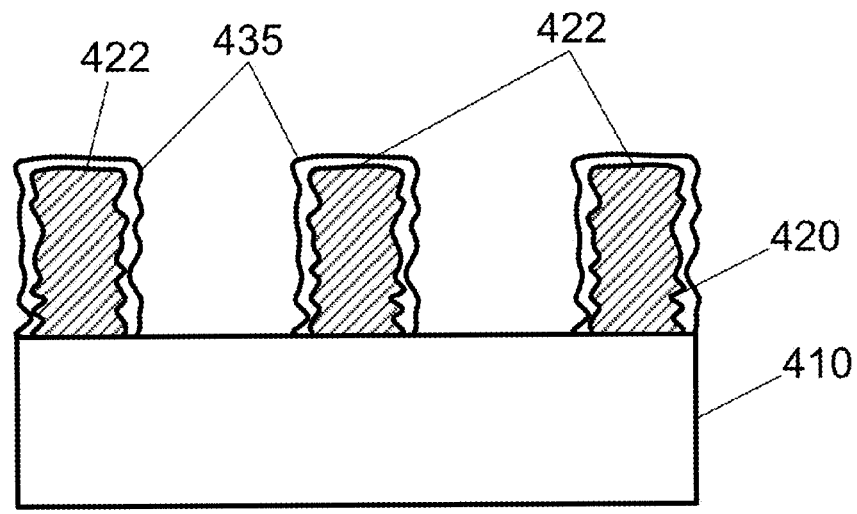
Figure 4D:
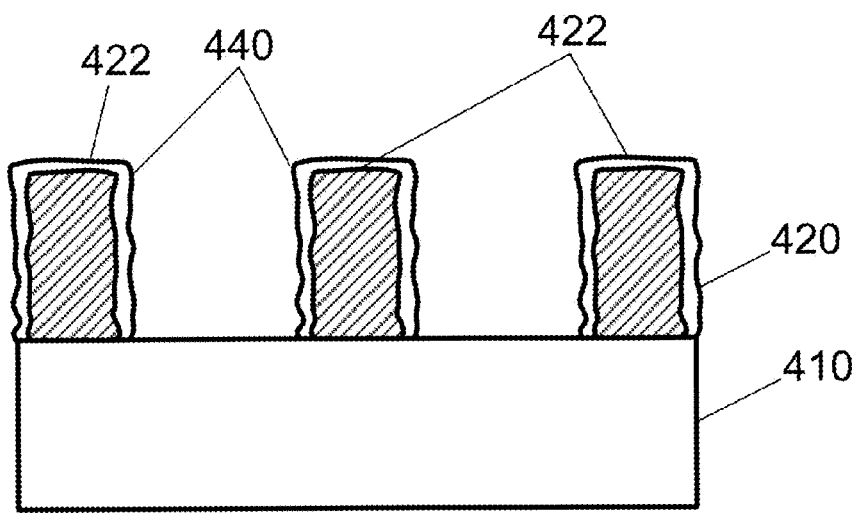

As shown in FIG. 4C, a chemically treated surface layer 435 is created as a result of the exposure of the layer of radiation-sensitive material 420 having pattern 422 prepared therein to the vapor-phase environment 430. The vapor-phase environment 430 reacts with the exposed portions of the layer of radiation-sensitive material 420 to cause "melting" or reflowing of the radiation-sensitive material within the chemically treated surface layer 435 and, thus, smooth the exposed surface of the layer of radiation-sensitive material 420 (see FIG. 4D).

Figure 4E:
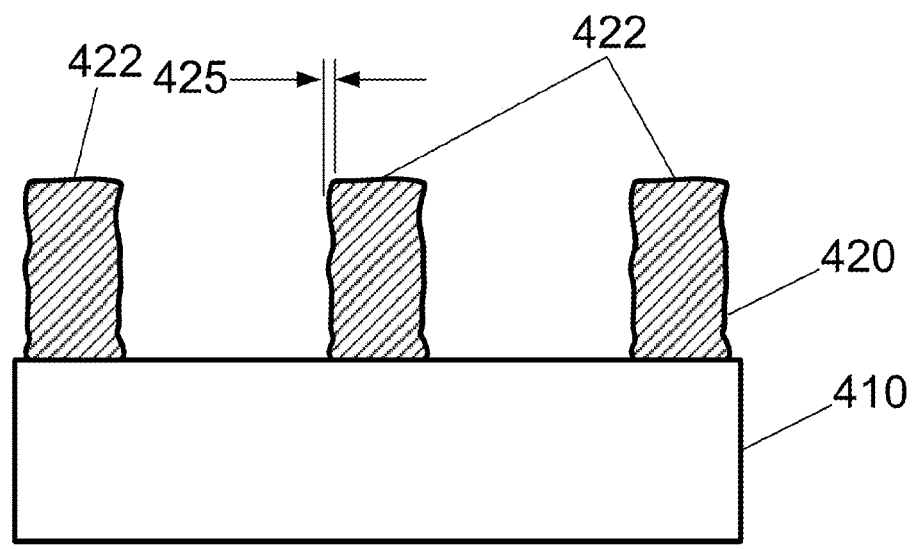

Thereafter, as shown in FIG. 4E, the pattern 422 is subjected to a drying process to remove any residue from the exposure to the vapor-phase environment 430. The drying process may include a spin drying process at atmospheric or vacuum pressure. The drying process may further include dispensing a drying fluid on the pattern 422. The drying fluid may be in a gaseous or liquid phase. For example, the drying fluid may include isopropyl alcohol (IPA).

As shown in FIGS. 10A and 10B, a vapor smoothing process is performed to reduce a first line width roughness (LWR) 1010 of about 5.7 nm (nanometers) with a line CD of 63.8 nm to a second LWR of about 3.8 nm with a line CD 1020 of about 64.7 nm.

The smoothing process may be performed preceding (see sequence position 401 in FIG. 3), following (see sequence position 404 in FIG. 3), or during (see sequence positions 402, 403 in FIG. 3) the CD slimming process. During the CD slimming process, the smoothing process may be performed following the dispensing of the second developing solution elevated to a hot develop temperature, and preceding the treating of the substrate with the treating compound containing acid (see sequence position 402 in FIG. 3). Alternatively, during the CD slimming process, the smoothing process may be performed following the baking of the substrate to diffuse acid, and preceding the dispensing of the third developing solution (see sequence position 403 in FIG. 3). Alternatively yet, one or more additional smoothing processes may be performed to further reduce the reduced roughness to another reduced roughness.

The method of patterning a substrate may further comprise characterizing the roughness by determining a pre-smoothing roughness (i.e., roughness 125 in FIG. 1A) assessed immediately prior to the smoothing process and determining a post-smoothing roughness (i.e., reduced roughness 135 in FIG. 1C) assessed immediately following the smoothing process, and achieving a reduction in the roughness exceeding 10%, wherein the reduction in the roughness is measured as a percentile ratio of a difference between the pre-smoothing roughness and the post-smoothing roughness to the pre-smoothing treatment roughness. Further yet, the smoothing process may achieve a reduction in the roughness exceeding 30%. Even further yet, the smoothing process may achieve a reduction in the roughness exceeding 50%.

Referring now to FIGS. 5A through 5G, and FIG. 6, a method for double patterning a substrate is illustrated according to another embodiment. The double patterning technique may include a Litho-Etch-Litho-Etch (LELE) technique, a Litho-Litho-Etch (LLE) technique, or a Litho-Freeze-Litho-Etch (LFLE) technique.

In LELE double patterning, the substrate is exposed to a first pattern, the first pattern is developed in the radiation-sensitive material, the first pattern formed in the radiation-sensitive material is transferred to an underlying layer using an etching process, and then this series of steps is repeated for a second pattern. As described above, a CD slimming process may be utilized to reduce the CD of the first pattern, or reduce the CD of the second pattern, or reduce the CD of both the first pattern and the second pattern. Further, as described above, a smoothing process may be utilized to reduce the roughness of the first pattern, or reduce the roughness of the second pattern, or reduce the roughness of both the first pattern and the second pattern.

In LLE double patterning, the substrate is exposed to a first pattern, the substrate is exposed to a second pattern, the first pattern and the second pattern are developed in the radiation-sensitive material, and the first pattern and the second pattern formed in the radiation-sensitive material are transferred to an underlying layer using an etching process. As described above, a CD slimming process may be utilized to reduce the CD of the first pattern, or reduce the CD of the second pattern, or reduce the CD of both the first pattern and the second pattern. Further, as described above, a smoothing process may be utilized to reduce the roughness of the first pattern, or reduce the roughness of the second pattern, or reduce the roughness of both the first pattern and the second pattern.

One approach to LLE double patterning includes a Litho-Freeze-Litho-Etch (LFLE) technique that utilizes an application of a freeze material on a first pattern in a first patterning layer to cause "freezing" or cross-linking therein, thus allowing the first patterning layer to withstand subsequent processing of a second patterning layer with a second pattern. The LFLE double patterning technique is now described in greater detail.

The method is illustrated in a flow chart 600, and begins in 610 with forming a first layer of radiation-sensitive material 520 on a substrate 510. The first layer of radiation-sensitive material 520 may include a photo-resist. For example, the first layer of radiation-sensitive material 520 may comprise a 248 nm (nanometer) resist, a 193 nm resist, a 157 nm resist, an EUV (extreme ultraviolet) resist, or an electron beam sensitive resist. Furthermore, for example, the first layer of radiation-sensitive material 520 may comprise a thermal freeze photo-resist, an electromagnetic (EM) radiation freeze photo-resist, or a chemical freeze photo-resist.

The first layer of radiation-sensitive material 520 may be formed by spin-coating the material onto substrate 510. The first layer of radiation-sensitive material 520 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 510 and one or more cooling cycles, following the one or more first PABs, to cool the substrate 510.

Figure 5A:
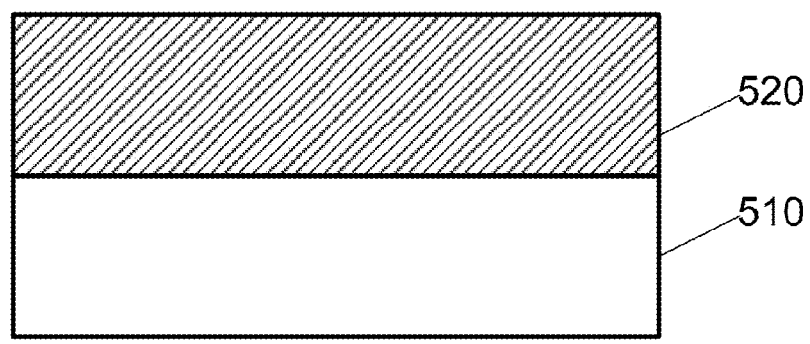
FIGS. 5A through 5G present a simplified schematic representation of a method of double patterning a substrate according to another embodiment.
Figure 5B:
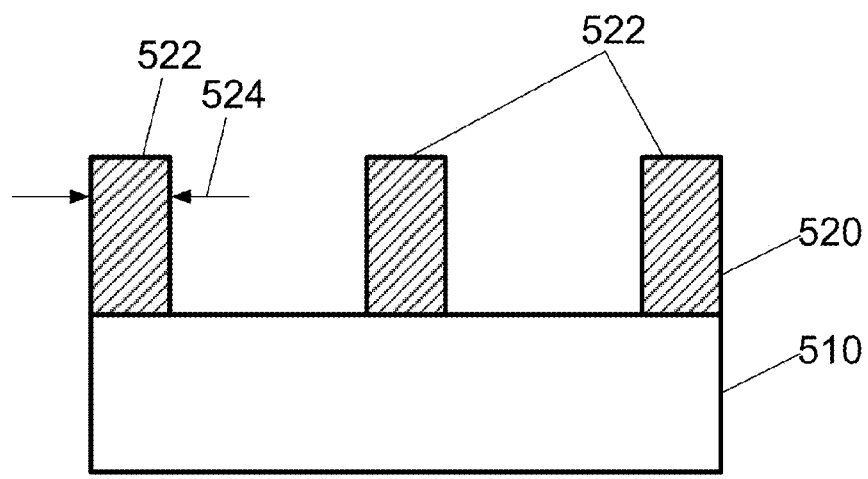

In 620 and as shown in FIG. 5B, the substrate 510 having the first layer of radiation-sensitive material 520 is aligned at a first alignment position in a radiation exposure system and imaged with first radiation having a first image pattern. The radiation exposure system may include a dry or wet photo-lithography system. The first image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the first image pattern may be formed using an electron beam lithography system.

The first layer of radiation-sensitive material 520, having been exposed to the first image pattern, is subjected to a developing process in order to remove the first image pattern region, and form a first pattern 522 in the first layer of radiation-sensitive material 520. The first pattern 522 may be characterized by a first critical dimension (CD) 524 and a first roughness. The first pattern 522 may include a first line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more first post-exposure bakes (PEB) to heat the substrate 510 and one or more cooling cycles, following the one or more first PEBs, to cool the substrate 510.

Figure 5C:
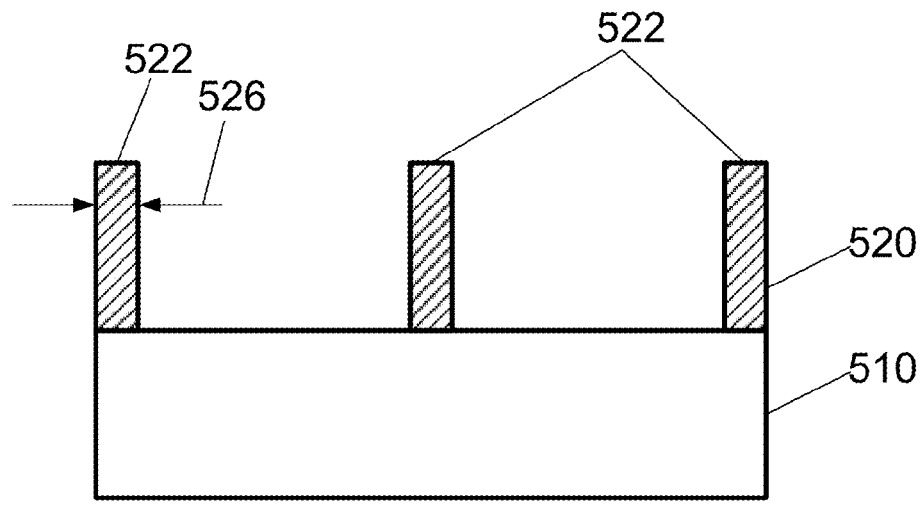

In 630 and as shown in FIG. 5C, a first critical dimension (CD) slimming process is performed to reduce the first CD 524 to a first reduced CD 526. FIG. 3 illustrates a CD slimming process, and FIGS. 9A and 9B provide exemplary data for the CD slimming process.

In 635, a first smoothing process is performed to reduce the first roughness to a first reduced roughness. FIGS. 4A through 4E illustrate a vapor smoothing process, and FIGS. 10A and 10B provide exemplary data for the vapor smoothing process. The first smoothing process may be performed preceding, during, or following the first CD slimming process.

Figure 5D:
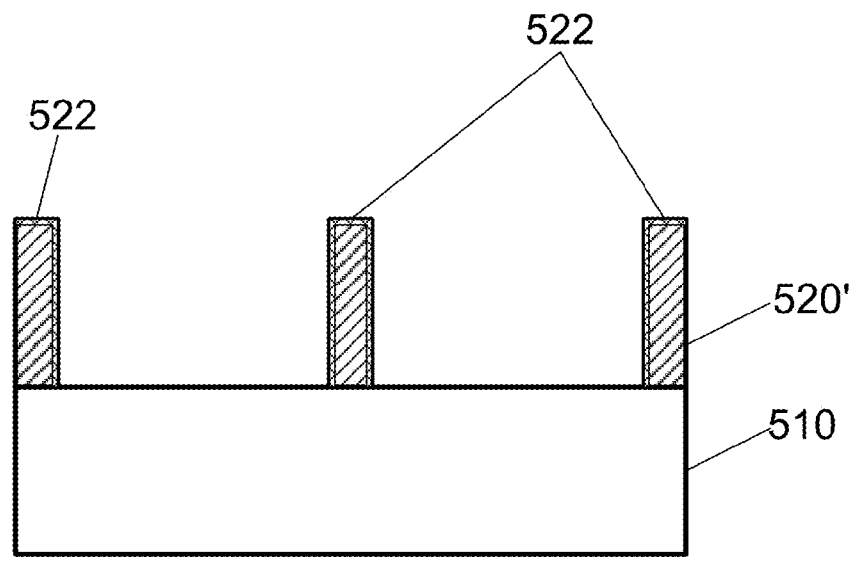

In 640 and as shown in FIG. 5D, the first pattern 522 with the first reduced CD 526 and the first roughness in the first layer of radiation-sensitive material 520 is frozen using a freeze process to form a frozen first layer of radiation-sensitive material 520'. In one embodiment, the first layer of radiation-sensitive material 520 may include a thermally curable freeze resist, wherein freezing the first pattern 522 in the first layer of radiation-sensitive material 520 using the freeze process comprises baking (or thermally heating) the first layer of radiation-sensitive material 520 to thermally cure and preserve the first pattern 522 with the first reduced CD 526. During the freeze process, the temperature and the bake time are process parameters that may be adjusted to achieve pattern CD control.

As will be discussed later and while not intended to be limiting, the terms "freeze", "freezing", "frozen", etc., as used herein, represent a process or a result of the process wherein a layer of radiation-sensitive material is prepared and/or treated to alter a condition of the layer of radiation-sensitive material to withstand subsequent lithographic processing. For example, once a pattern is frozen in the layer of radiation-sensitive material, the pattern substantially remains with or without some change to the pattern CD following an additional lithographic process.

In an alternate embodiment, the first layer of radiation-sensitive material 520 may include an electromagnetic (EM) radiation curable freeze resist, wherein freezing the first pattern 522 in the first layer of radiation-sensitive material 520 using the freeze process comprises exposing the first layer of radiation-sensitive material 520 to EM radiation to radiatively cure and preserve the first pattern 522 with the first reduced CD 526. During the freeze process, the EM intensity and the time for exposure are process parameters that may be adjusted to achieve pattern CD control.

In yet another alternate embodiment, the first layer of radiation-sensitive material 520 may include a chemically curable freeze resist, wherein freezing the first pattern 522 in the first layer of radiation-sensitive material 520 using the freeze process comprises applying a chemical freeze material to and reacting the chemical freeze material with the first layer of radiation-sensitive material 520 to chemically cure and preserve the first pattern 522 with the first reduced CD 526. During the freeze process, the concentration and type of the chemical freeze material, and the time for exposure are process parameters that may be adjusted to achieve pattern CD control.

Therein, a chemical freeze material may be applied over the first layer of radiation-sensitive material 520 to chemically interact with the first layer of radiation-sensitive material 520. The chemical freeze material may be formed by spin-coating the material onto substrate 510. The chemical freeze material may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more bake processes to heat substrate 510 and cure at least a portion of the chemical freeze material.

As a result of applying the chemical freeze material to substrate 510 and heating substrate 510, a portion of the chemical freeze material reacts with the exposed surface of the first layer of radiation-sensitive material 520 to form the frozen first layer of radiation-sensitive material 520'. Thereafter, the chemical freeze material is stripped from the substrate 510 using a strip solution to preserve the first pattern 522 in the frozen first layer of radiation-sensitive material 520'. The strip solution may contain a conventional strip solution or a high normality strip solution. For example, the strip solution contains an active solute having a normality (N) greater than 0.26. Alternatively, the strip solution contains an active solute having a normality (N) greater than 0.3. Alternatively, the strip solution contains an active solute having a normality (N) greater than 0.4. Alternatively, the strip solution contains an active solute having a normality (N) greater than 0.5.

The strip solution may comprise an aqueous alkali solution. Additionally, the strip solution may contain a hydroxide. Additionally, the strip solution may contain a quaternary ammonium hydroxide. Furthermore, the strip solution may include tetramethyl ammonium hydroxide (TMAH). The normality (N) of TMAH in the strip solution may be equal to or greater than 0.26. Alternatively, the normality (N) of TMAH in the strip solution may be greater than or equal to 0.3. Alternatively, the normality (N) of TMAH in the strip solution may be greater than or equal to 0.4. Alternatively, the normality (N) of TMAH in the strip solution may be greater than or equal to 0.5. Alternatively yet, the normality (N) of TMAH in the strip solution may be about 0.32. The concentration of TMAH in the strip solution may be equal to or greater than 2.36% w/v (or 2.36 grams of solute per 100 milliliters (ml) of solution). Alternatively, the concentration of TMAH in the strip solution may be greater than 2.72% w/v (or 2.72 grams of solute per 100 milliliters (ml) of solution). Conventional strip solutions have a normality (N) of 0.26 or less. For example, TMAH-based strip solutions are readily available from a commercial vendor with a normality of 0.26. The increase of the normality (N) in excess of 0.26 leads to an increase in substrate throughput for the double patterning process and a decrease in substrate defectivity which affects device yield.

In each embodiment, the freeze process creates a protective layer, extending partly or wholly through the first pattern 522, that protects the first pattern 522 in the first layer of radiation-sensitive material 520 from subsequent lithographic processes, such as coating, exposing, developing, and slimming processes, hence, "freezing" the first layer of radiation-sensitive material 520 to form the frozen first layer of radiation-sensitive material 520' characterized by the first reduced CD.

The first layer of radiation-sensitive material, whether it be a thermally curable freeze resist, an EM curable freeze resist, or a chemically curable freeze resist, may include a material that exhibits cross-linking when thermally treated, radiatively treated, or chemically treated. Additionally, the chemical freeze material may include any removable material that may cause cross-linking in a layer of radiation-sensitive material. The chemical freeze material may include a polymeric material. For example, these materials may include materials commercially available from JSR Micro, Inc. (1280 North Mathilda Avenue, Sunnyvale, Calif. 94089), including, for example, FZX F112 freeze material. Alternatively, for example, these materials may include materials commercially available from Rohm and Haas, a wholly owned subsidiary of Dow Chemical Company (100 Independence Mall West, Philadelphia, Pa. 19106), including, for example, SC™ 1000 Surface Curing Agents (SCA).

Figure 5E:
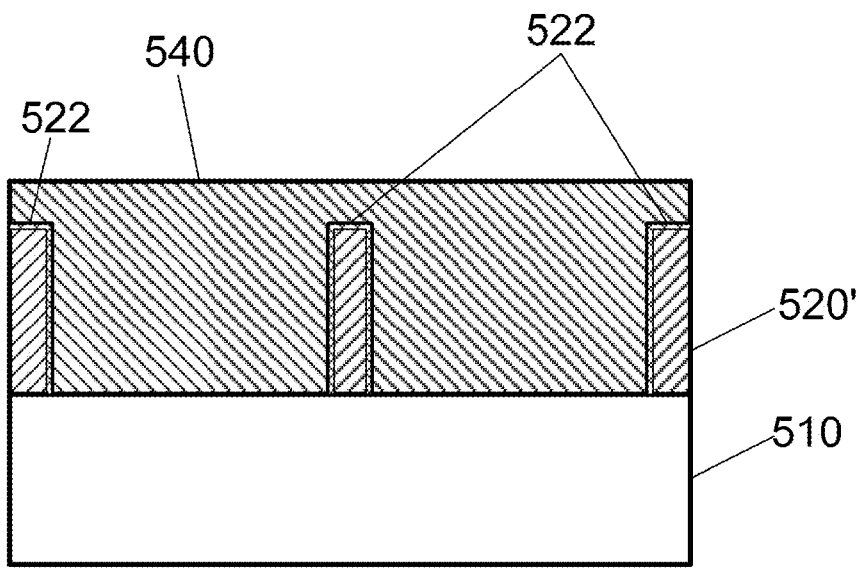

In 650 and as shown in FIG. 5E, a second layer of radiation-sensitive material 540 is formed on substrate 510. The second layer of radiation-sensitive material 540 may include a photo-resist. For example, the second layer of radiation-sensitive material 540 may comprise a 248 nm (nanometer) resist, a 193 nm resist, a 157 nm resist, an EUV (extreme ultraviolet) resists, or an electron beam sensitive resist. The second layer of radiation-sensitive material 540 may be formed by spin-coating the material onto substrate 510. The second layer of radiation-sensitive material 540 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more second PABs to heat the substrate 510 and one or more cooling cycles, following the one or more second PABs, to cool the substrate 510.

Figure 5F:
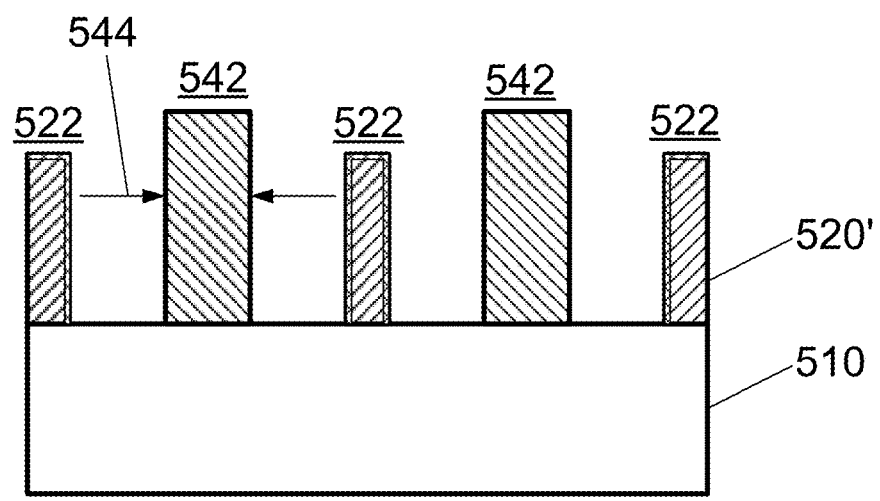

In 660 and as shown in FIG. 5F, the substrate 510 having the second layer of radiation-sensitive material 540 is aligned at a second alignment position in a radiation exposure system and imaged with second radiation having a second image pattern. The second radiation may be the same as the first radiation or different than the first radiation. The radiation exposure system may include a dry or wet photo-lithography system. The second image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the second image pattern may be formed using an electron beam lithography system.

The second layer of radiation-sensitive material 540, having been exposed to the second image pattern, is subjected to a developing process in order to remove the second image pattern region, and form a second pattern 542 in the second layer of radiation-sensitive material 540. The second pattern 542 may be characterized by a second critical dimension (CD) 544 and a second roughness. The second pattern 542 may include a second line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more second PEBs to heat the substrate 510 and one or more cooling cycles, following the one or more second PEBs, to cool the substrate 510.

Figure 5G:
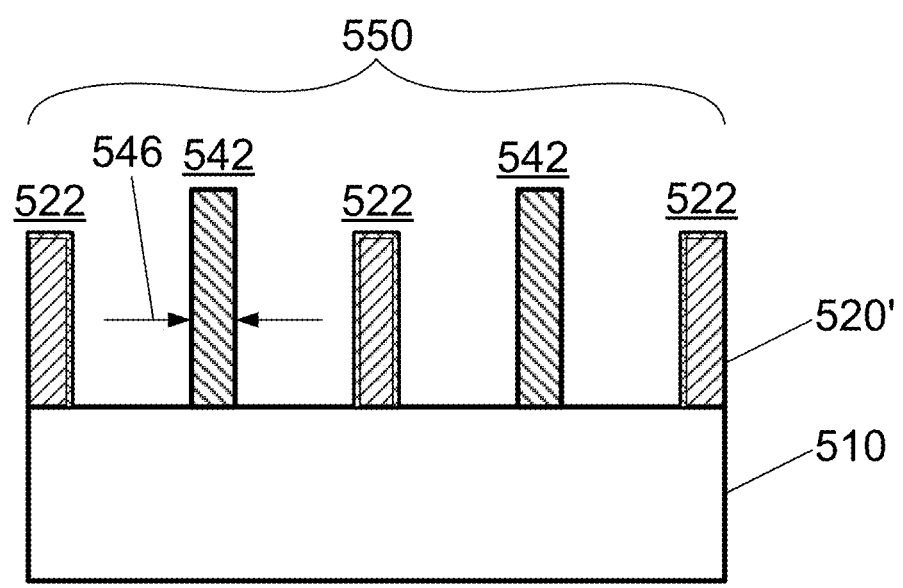
Figure 6:
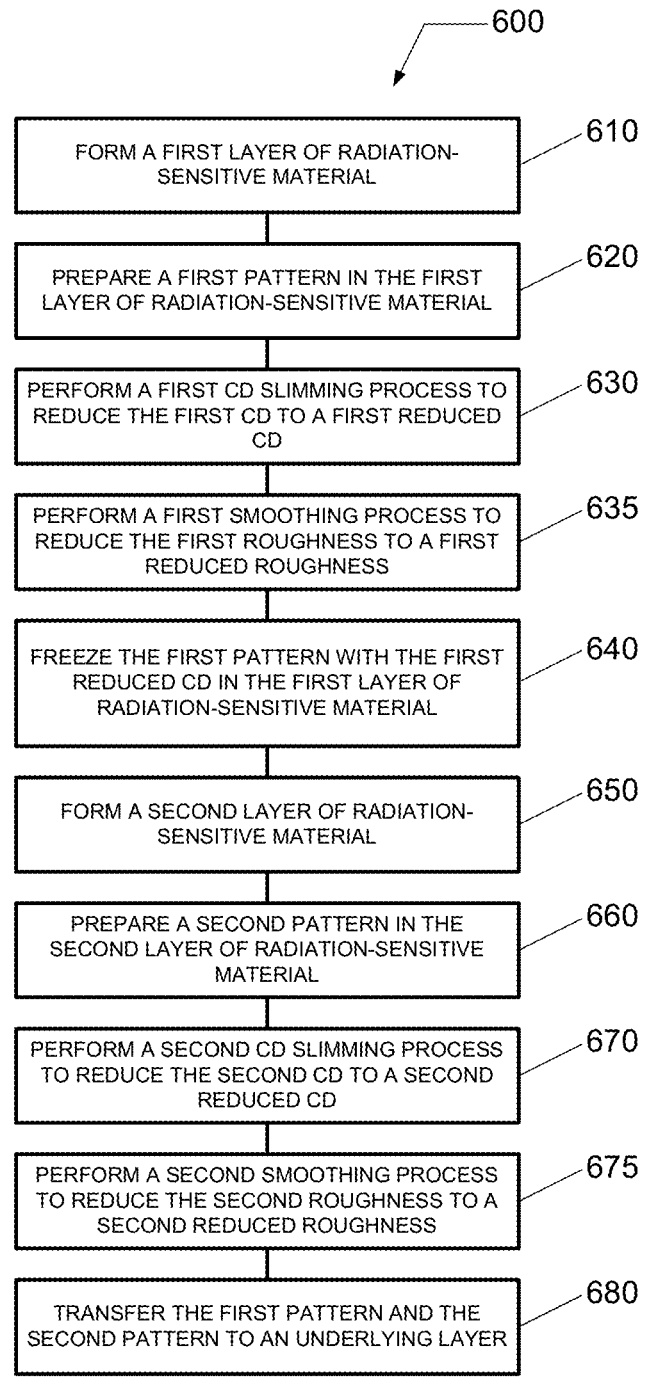
FIG. 6 provides a flow chart illustrating a method of double patterning a substrate according to another embodiment.

In 670 and as shown in FIG. 5G, a second critical dimension (CD) slimming process is performed to reduce the second CD 544 to a second reduced CD 546, thus leaving behind a double pattern 550 having the first pattern 522 and the second pattern 542. FIG. 3 illustrates a CD slimming process, and FIGS. 9A and 9B provide exemplary data for the CD slimming process.

In 675, a second smoothing process is performed to reduce the second roughness to a second reduced roughness. FIGS. 4A through 4E illustrate a vapor smoothing process, and FIGS. 10A and 10B provide exemplary data for the vapor smoothing process. The second smoothing process may be performed preceding, during, or following the second CD slimming process.

In 680, the double pattern 550, including the first pattern 522 with the first reduced CD 526 and first reduced roughness, and the second pattern 542 with the second reduced CD 546 and second reduced roughness, is transferred to an underlying layer of the substrate 510 using one or more etching processes. The one or more etching processes may include any combination of wet or dry etching processes. The dry etching processes may include dry plasma etching processes or dry non-plasma etching processes.

At least one process parameter for the first CD slimming process, the first smoothing process, the second CD slimming process, the second smoothing process, the freeze process, the first lithographic process, or the second lithographic process, or any combination of two or more thereof may be optimized to prevent collapse of the first pattern and the second pattern. Further, at least one process parameter for the first CD slimming process, the first smoothing process, the second CD slimming process, the second smoothing process, the freeze process, the first lithographic process, or the second lithographic process, or any combination of two or more thereof may be optimized to produce the second reduced CD in the second pattern while minimally impacting the first reduced CD in the first pattern that has been subjected to the freeze process.

As an example, the first CD for the first pattern and/or the second CD for the second pattern may be adjusted to achieve optimal printing of the first and second patterns with reduced CD and reduced roughness. Alternatively, as an example, the amount of reduction between the first CD and the first reduced CD, the amount of reduction between the first roughness and the first reduced roughness, the amount of reduction between the second CD and the second reduced CD, and/or the amount of reduction between the second roughness and the second reduced roughness may be adjusted to achieve optimal printing of the first and second patterns with reduced CD and reduced roughness.

In one embodiment, the second CD slimming process may be designed to achieve the second reduced CD in the second pattern, while minimally impacting the first reduced CD in the first pattern. For example, the first lithographic process and the second lithographic process may be performed to print a first CD and a second CD that are substantially or approximately equivalent. Thereafter, the first CD slimming process reduces the first CD to the first reduced CD, and the second CD slimming process reduces the second CD to the second reduced CD, while not impacting the first reduced CD, such that the first reduced CD and the second reduced CD are substantially or approximately equivalent.

In an alternate embodiment, the second CD slimming process may be designed to achieve reduction of both the first reduced CD and the second CD. For example, the first lithographic process and the second lithographic process may be performed to achieve a first CD and a second CD, wherein the first CD is printed larger than the second CD. Additionally, for example, the first CD may be printed up to about 5% larger than the second CD. Additionally, for example, the first CD may be printed up to about 10% larger than the second CD. Additionally, for example, the first CD may be printed up to about 15% larger than the second CD. Additionally, for example, the first CD may be printed up to about 25% larger than the second CD. Additionally, for example, the first CD may be printed about 25% to about 50% larger than the second CD. Additionally yet, for example, the first CD may be printed about 50% to about 75% larger than the second CD. Thereafter, the first CD slimming process reduces the first CD to the first reduced CD, and the second CD slimming process reduces the second CD to the second reduced CD, while further reducing the first reduced CD to a third reduced CD, such that the third reduced CD and the second reduced CD are substantially or approximately equivalent.

Referring now to FIGS. 7A through 7J, and FIG. 8, a method for multi-patterning a substrate is illustrated according to yet another embodiment. The multi-patterning technique may include a sidewall image transfer (SIT) technique. The SIT technique may be integrated with a single patterning technique (see FIGS. 1A through 1C) to produce a double pattern, or it may be integrated with a double patterning technique (see FIGS. 7A through 7G) to produce a quadruple pattern. The integration of the SIT technique with a LFLE double patterning technique is now described in greater detail.

The method is illustrated in a flow chart 800, and begins in 810 with preparing a pattern in a layer of radiation-sensitive material using a lithographic process, wherein the pattern is characterized by a critical dimension (CD).

Figure 7A:
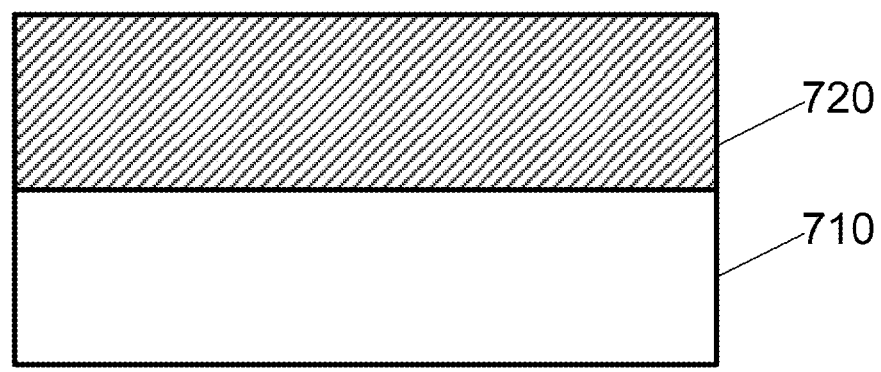
FIGS. 7A through 7J present a simplified schematic representation of a method of double patterning a substrate according to another embodiment.
Figure 7B:
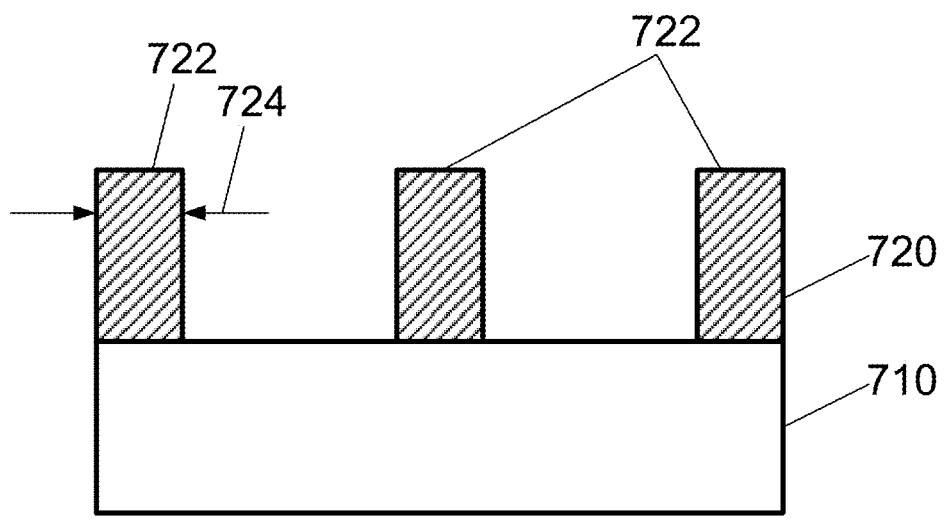

As shown in FIG. 7A, the preparing of the pattern may include forming a first layer of radiation-sensitive material 720 on a substrate 710. The first layer of radiation-sensitive material 720 may include a photo-resist. For example, the first layer of radiation-sensitive material 720 may comprise a 248 nm (nanometer) resist, a 193 nm resist, a 157 nm resist, an EUV (extreme ultraviolet) resist, or an electron beam sensitive resist. Furthermore, for example, the first layer of radiation-sensitive material 720 may comprise a thermal freeze photo-resist, an electromagnetic (EM) radiation freeze photo-resist, or a chemical freeze photo-resist.

The first layer of radiation-sensitive material 720 may be formed by spin-coating the material onto substrate 710. The first layer of radiation-sensitive material 720 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 710 and one or more cooling cycles, following the one or more first PABs, to cool the substrate 710.

As shown in FIG. 8B, the preparing of the pattern may further include preparing a first pattern 722 in the first layer of radiation-sensitive material 720 using a first lithographic process, wherein the first pattern 722 is characterized by a first critical dimension (CD) 124 and a first roughness. The substrate 710 having the first layer of radiation-sensitive material 720 is aligned at a first alignment position in a radiation exposure system and imaged with first radiation having a first image pattern. The radiation exposure system may include a dry or wet photo-lithography system. The first image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the first image pattern may be formed using an electron beam lithography system.

The first layer of radiation-sensitive material 720, having been exposed to the first image pattern, is subjected to a developing process in order to remove the first image pattern region, and form the first pattern 722 in the first layer of radiation-sensitive material 720. The first pattern 722 may be characterized by the first CD 724 and the first roughness. The first pattern 722 may include a first line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more first post-exposure bakes (PEB) to heat the substrate 710 and one or more cooling cycles, following the one or more first PEBs, to cool the substrate 710.

Figure 7C:
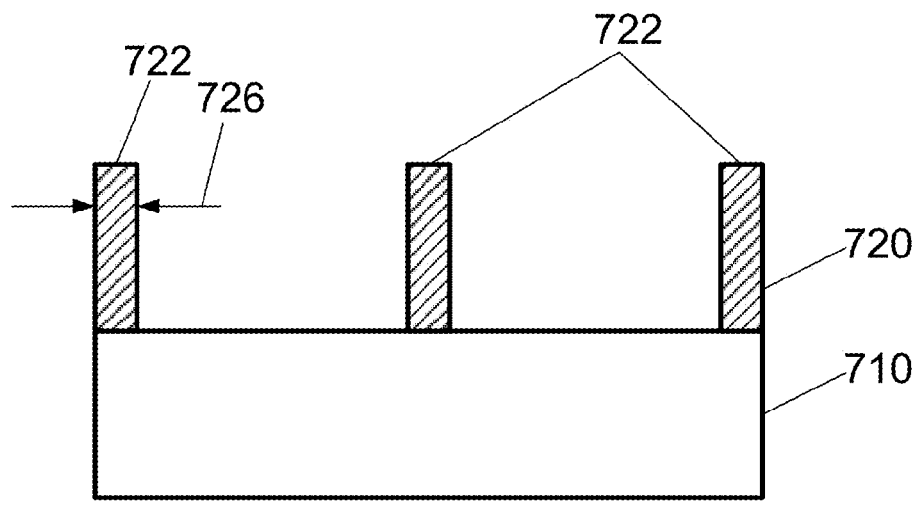

In 820, a CD slimming process is performed, following the preparing of the pattern, to reduce the CD to a reduced CD. The performing the CD slimming process may include, as shown in FIG. 7C, performing a first CD slimming process to reduce the first CD 724 to a first reduced CD 726. FIG. 3 illustrates a CD slimming process, and FIGS. 9A and 9B provide exemplary data for the CD slimming process.

In 825, a smoothing process is performed, following the preparing of the pattern, to reduce the roughness to a reduced roughness. The performing the smoothing process may include performing a first smoothing process to reduce the first roughness to a first reduced roughness. FIGS. 4A through 4E illustrate a vapor smoothing process, and FIGS. 10A and 10B provide exemplary data for the vapor smoothing process. The first smoothing process may be performed preceding, during, or following the first CD slimming process.

Figure 7D:
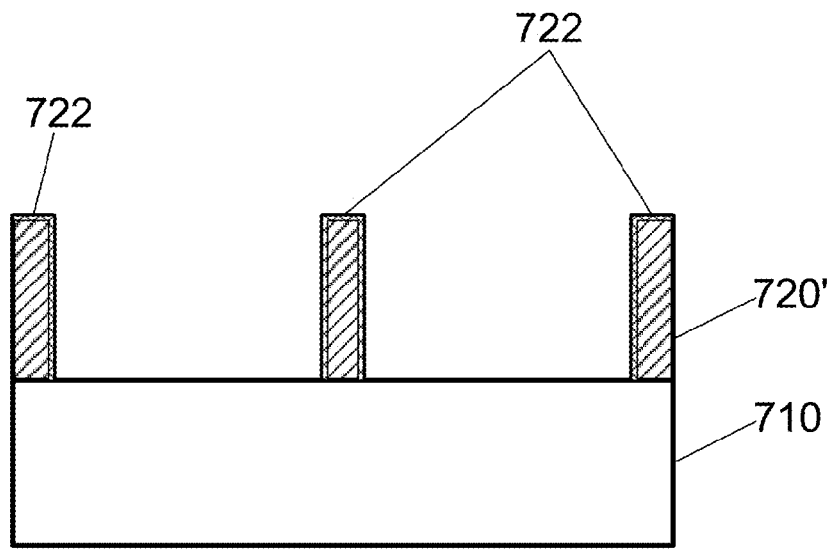

As shown in FIG. 7D, the first pattern 722 with the first reduced CD 726 and the first reduced roughness in the first layer of radiation-sensitive material 720 is frozen using a freeze process to form a frozen first layer of radiation-sensitive material 720'. In one embodiment, the first layer of radiation-sensitive material 720 may include a thermally curable freeze resist, wherein freezing the first pattern 722 in the first layer of radiation-sensitive material 720 using the freeze process comprises baking (or thermally heating) the first layer of radiation-sensitive material 720 to thermally cure and preserve the first pattern 722 with the first reduced CD 726. During the freeze process, the temperature and the bake time are process parameters that may be adjusted to achieve pattern CD control.

As will be discussed later and while not intended to be limiting, the terms "freeze", "freezing", "frozen", etc., as used herein, represent a process or a result of the process wherein a layer of radiation-sensitive material is prepared and/or treated to alter a condition of the layer of radiation-sensitive material to withstand subsequent lithographic processing. For example, once a pattern is frozen in the layer of radiation-sensitive material, the pattern substantially remains with or without some change to the pattern CD following an additional lithographic process.

In an alternate embodiment, the first layer of radiation-sensitive material 720 may include an EM radiation curable freeze resist, wherein freezing the first pattern 722 in the first layer of radiation-sensitive material 720 using the freeze process comprises exposing the first layer of radiation-sensitive material 720 to EM radiation to radiatively cure and preserve the first pattern 722 with the first reduced CD 726. During the freeze process, the EM intensity and the time for exposure are process parameters that may be adjusted to achieve pattern CD control.

In yet another alternate embodiment, the first layer of radiation-sensitive material 720 may include a chemically curable freeze resist, wherein freezing the first pattern 722 in the first layer of radiation-sensitive material 720 using the freeze process comprises applying a chemical freeze material to and reacting the chemical freeze material with the first layer of radiation-sensitive material 720 to chemically cure and preserve the first pattern 722 with the first reduced CD 726. During the freeze process, the concentration and type of the chemical freeze material, and the time for exposure are process parameters that may be adjusted to achieve pattern CD control.

Therein, a chemical freeze material may be applied over the first layer of radiation-sensitive material 720 to chemically interact with the first layer of radiation-sensitive material 720. The chemical freeze material may be formed by spin-coating the material onto substrate 710. The chemical freeze material may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more bake processes to heat substrate 710 and cure at least a portion of the chemical freeze material.

As a result of applying the chemical freeze material to substrate 710 and heating substrate 710, a portion of the chemical freeze material reacts with the exposed surface of the first layer of radiation-sensitive material 720 to form the frozen first layer of radiation-sensitive material 720'. Thereafter, the chemical freeze material is stripped from the substrate 710 using a strip solution to preserve the first pattern 722 in the frozen first layer of radiation-sensitive material 720'. The strip solution may contain a conventional strip solution or a high normality strip solution. For example, the strip solution contains an active solute having a normality (N) greater than 0.26. Alternatively, the strip solution contains an active solute having a normality (N) greater than 0.3. Alternatively, the strip solution contains an active solute having a normality (N) greater than 0.4. Alternatively, the strip solution contains an active solute having a normality (N) greater than 0.5.

The strip solution may comprise an aqueous alkali solution. Additionally, the strip solution may contain a hydroxide. Additionally, the strip solution may contain a quaternary ammonium hydroxide. Furthermore, the strip solution may include tetramethyl ammonium hydroxide (TMAH). The normality (N) of TMAH in the strip solution may be equal to or greater than 0.26. Alternatively, the normality (N) of TMAH in the strip solution may be greater than or equal to 0.3. Alternatively, the normality (N) of TMAH in the strip solution may be greater than or equal to 0.4. Alternatively, the normality (N) of TMAH in the strip solution may be greater than or equal to 0.5. Alternatively yet, the normality (N) of TMAH in the strip solution may be about 0.32. The concentration of TMAH in the strip solution may be equal to or greater than 2.36% w/v (or 2.36 grams of solute per 100 milliliters (ml) of solution). Alternatively, the concentration of TMAH in the strip solution may be greater than 2.72% w/v (or 2.72 grams of solute per 100 milliliters (ml) of solution). Conventional strip solutions have a normality (N) of 0.26 or less. For example, TMAH-based strip solutions are readily available from a commercial vendor with a normality of 0.26. The increase of the normality (N) in excess of 0.26 leads to an increase in substrate throughput for the double patterning process and a decrease in substrate defectivity which affects device yield.

In each embodiment, the freeze process creates a protective layer, extending partly or wholly through the first pattern 722, that protects the first pattern 722 in the first layer of radiation-sensitive material 720 from subsequent lithographic processes, such as coating, exposing, developing, and slimming processes, hence, "freezing" the first layer of radiation-sensitive material 720 to form the frozen first layer of radiation-sensitive material 720' characterized by the first reduced CD.

The first layer of radiation-sensitive material, whether it be a thermally curable freeze resist, an EM curable freeze resist, or a chemically curable freeze resist, may include a material that exhibits cross-linking when thermally treated, radiatively treated, or chemically treated. Additionally, the chemical freeze material may include any removable material that may cause cross-linking in a layer of radiation-sensitive material. The chemical freeze material may include a polymeric material. For example, these materials may include materials commercially available from JSR Micro, Inc. (1280 North Mathilda Avenue, Sunnyvale, Calif. 94089), including, for example, FZX F112 freeze material. Alternatively, for example, these materials may include materials commercially available from Rohm and Haas, a wholly owned subsidiary of Dow Chemical Company (100 Independence Mall West, Philadelphia, Pa. 19106), including, for example, SC™ 1000 Surface Curing Agents (SCA).

Figure 7E:
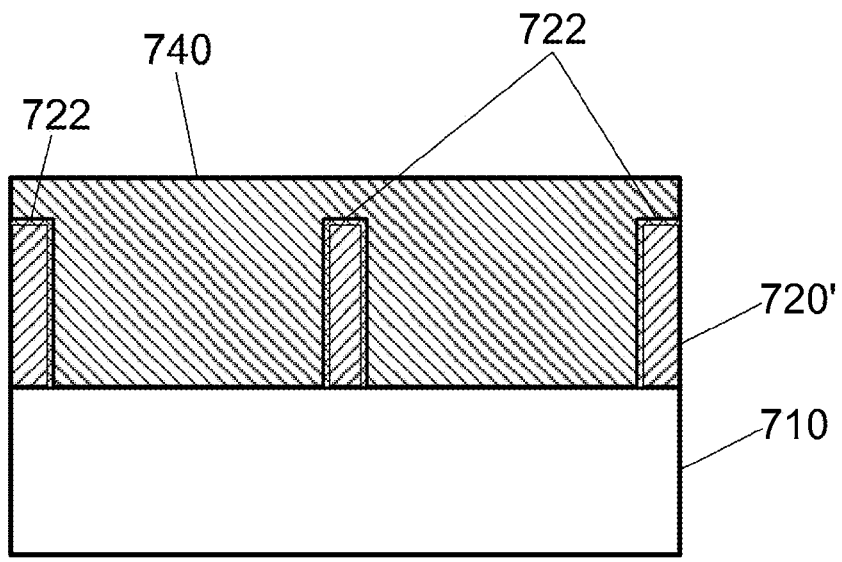

As shown in FIG. 7E, the preparing of the pattern may further include forming a second layer of radiation-sensitive material 740 on substrate 710. The second layer of radiation-sensitive material 740 may include a photo-resist. For example, the second layer of radiation-sensitive material 740 may comprise a 248 nm (nanometer) resist, a 193 nm resist, a 157 nm resist, an EUV (extreme ultraviolet) resists, or an electron beam sensitive resist. The second layer of radiation-sensitive material 740 may be formed by spin-coating the material onto substrate 710. The second layer of radiation-sensitive material 740 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more second PABs to heat the substrate 710 and one or more cooling cycles, following the one or more second PABs, to cool the substrate 710.

Figure 7F:
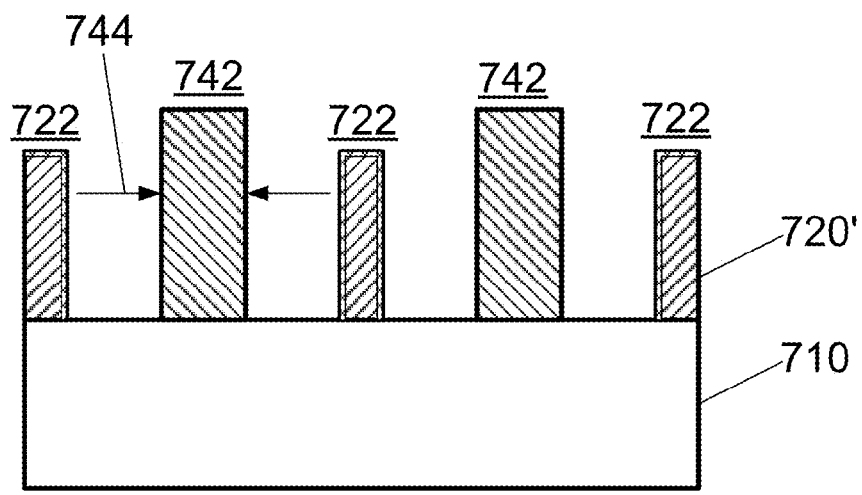

As shown in FIG. 7F, the preparing of the pattern may further include preparing a second pattern 742 in the second layer of radiation-sensitive material 740 using a second lithographic process, wherein the second pattern 742 is characterized by a second CD 744 and a second roughness. The substrate 710 having the second layer of radiation-sensitive material 740 is aligned at a second alignment position in a radiation exposure system and imaged with second radiation having a second image pattern. The second radiation may be the same as the first radiation or different than the first radiation. The radiation exposure system may include a dry or wet photo-lithography system. The second image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the second image pattern may be formed using an electron beam lithography system.

The second layer of radiation-sensitive material 740, having been exposed to the second image pattern, is subjected to a developing process in order to remove the second image pattern region, and form a second pattern 742 in the second layer of radiation-sensitive material 740. The second pattern 742 may be characterized by the second critical dimension (CD) 744 and second roughness. The second pattern 742 may include a second line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more second PEBs to heat the substrate 710 and one or more cooling cycles, following the one or more second PEBs, to cool the substrate 710.

Figure 7G:
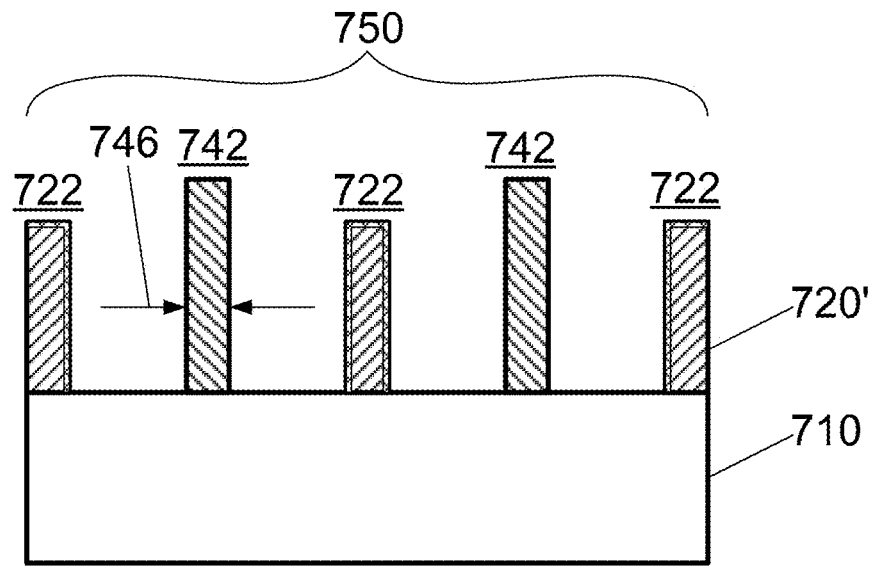

The performing the CD slimming process may further include, as shown in FIG. 7G, performing a second CD slimming process to reduce the second CD 744 to a second reduced CD 746, thus leaving behind a mandrel pattern 750 having the first pattern 722 and the second pattern 742. FIG. 3 illustrates a CD slimming process, and FIGS. 9A and 9B provide exemplary data for the CD slimming process.

The performing the smoothing process may further include performing a second smoothing process to reduce the second roughness to a second reduced roughness. FIGS. 4A through 4E illustrate a vapor smoothing process, and FIGS. 10A and 10B provide exemplary data for the vapor smoothing process. The second smoothing process may be performed preceding, during, or following the second CD slimming process.

Figure 7H:
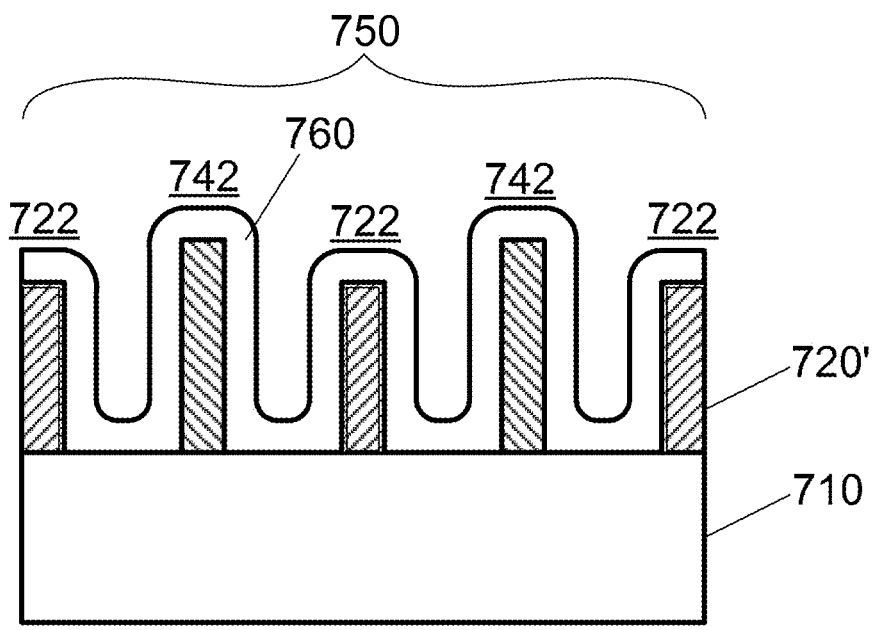

In 830 and as shown in FIG. 7H, a material layer 760 is conformally deposited over the pattern with the reduced CD and the reduced roughness, wherein the pattern with the reduced CD and reduced roughness may include the mandrel pattern 750 including the first pattern 722 with the first reduced CD 726 and first reduced roughness, and the second pattern 742 with the second reduced CD 746 and second reduced roughness. The technique of conformally depositing material layer 160 may include a CVD (chemical vapor deposition) process, a plasma enhanced CVD process, an atomic layer deposition (ALD) process, a plasma enhanced ALD process, or more generally, a monolayer deposition process.

The material layer 760 may include an oxide, a nitride, or an oxynitride. For example, the material layer 760 may include silicon oxide ($SiO_x$), silicon nitride ($SiN_y$), or silicon oxynitride ($SiO_xN_y$). However, the material layer 760 may include other materials.

Figure 7I:
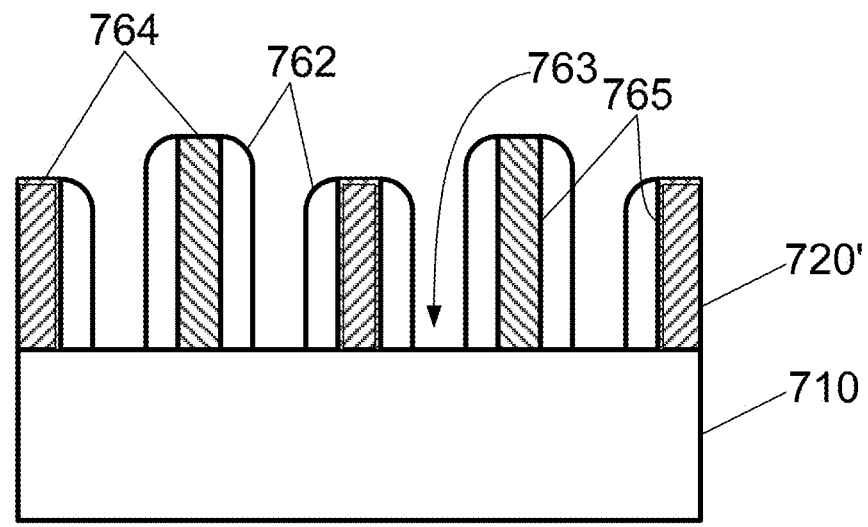

In 840 and as shown in FIG. 7I, the material layer 760 is partially removed using an etching process to expose a top surface 764 of the pattern, such as mandrel pattern 750, and open a portion of the material layer 760 at a bottom region 763 between adjacent features of the pattern. As a result, a remaining portion 762 of the material layer 760 is retained on sidewalls 765 of the pattern. The etching process may include any combination of a wet or dry etching process. The dry etching process may include a dry plasma etching process or a dry non-plasma etching process. In one embodiment, a dry plasma etching process using plasma formed of a process composition containing $C_xF_y$ and/or $C_xF_yH_z$ is contemplated.

Figure 7J:
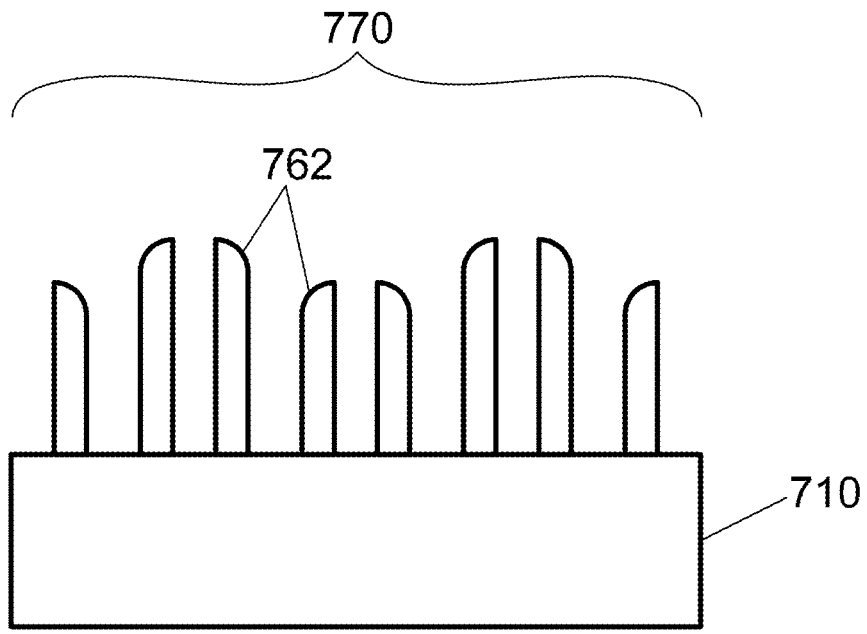
Figure 8:
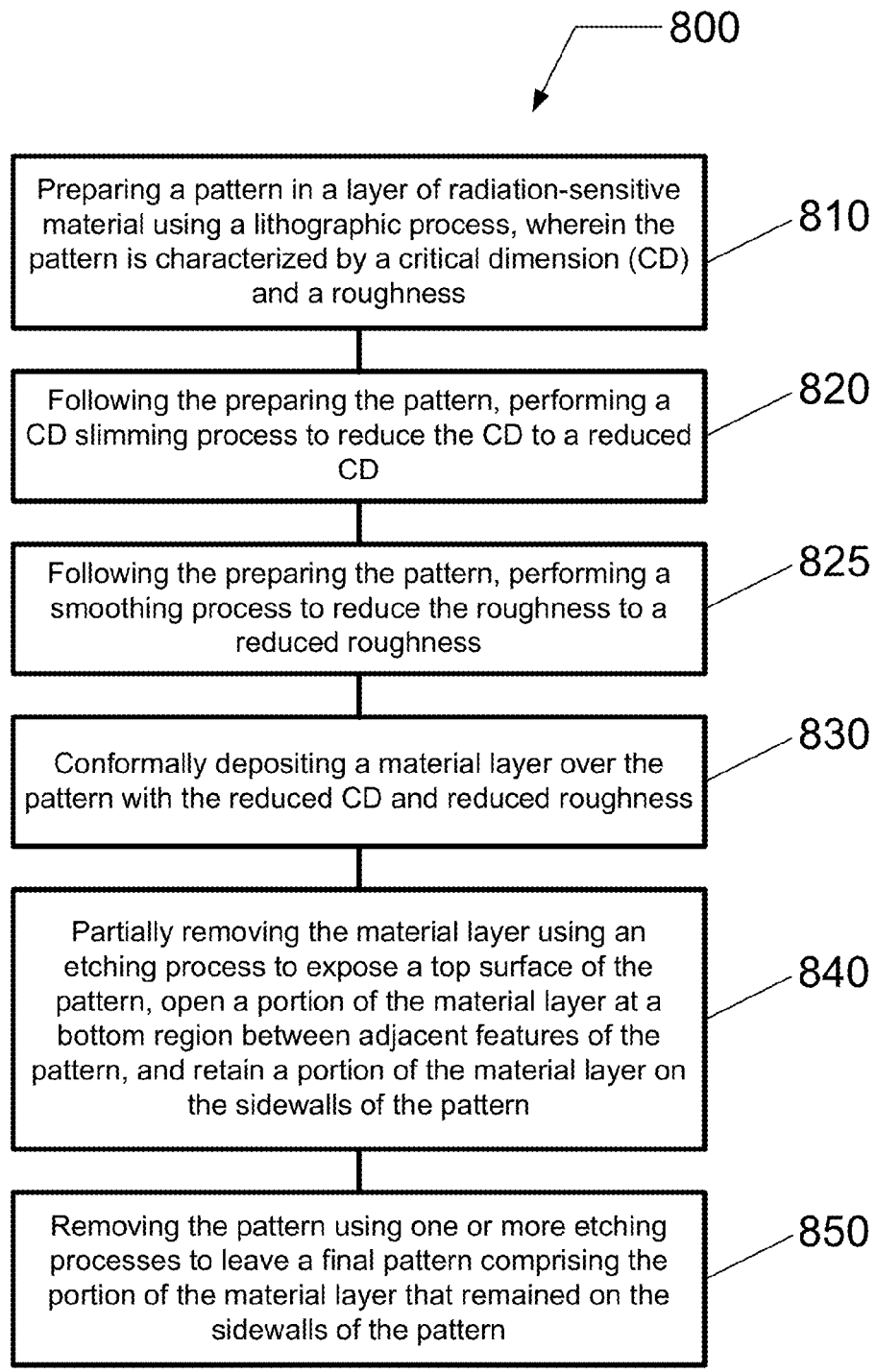
FIG. 8 provides a flow chart illustrating a method of double patterning a substrate according to another embodiment.

In 850 and as shown in FIG. 7J, the pattern, such as the mandrel pattern 750 including the first pattern 722 with the first reduced CD 726 and the second pattern 742 with the second reduced CD 746, is removed using one or more etching processes to leave a final pattern 770 comprising the remaining portion 762 of the material layer 760 that remained on the sidewalls 765 of the pattern. As a result, final pattern 770 may include a quadruple pattern originating from the first and second patterns (722, 742). The one or more etching processes may include any combination of wet or dry etching processes. The dry etching processes may include dry plasma etching processes or dry non-plasma etching processes. In one embodiment, a wet etching process is contemplated. In an alternate embodiment, a dry plasma etching process using plasma formed of a process composition containing oxygen is contemplated.

Thereafter, the final pattern 770, including the remaining portion 762 of the material layer 760, is transferred to an underlying layer of the substrate 710 using one or more etching processes. The one or more etching processes may include any combination of wet or dry etching processes. The dry etching processes may include dry plasma etching processes or dry non-plasma etching processes.

At least one process parameter for the first CD slimming process, the first smoothing process, the second CD slimming process, the second smoothing process, the freeze process, the first lithographic process, or the second lithographic process, or any combination of two or more thereof may be optimized to prevent collapse of the first pattern and the second pattern. Further, at least one process parameter for the first CD slimming process, the first smoothing process, the second CD slimming process, the second smoothing process, the freeze process, the first lithographic process, or the second lithographic process, or any combination of two or more thereof may be optimized to produce the second reduced CD in the second pattern while minimally impacting the first reduced CD in the first pattern that has been subjected to the freeze process.

As an example, the first CD for the first pattern and/or the second CD for the second pattern may be adjusted to achieve optimal printing of the first and second patterns with reduced CD and reduced roughness. Alternatively, as an example, the amount of reduction between the first CD and the first reduced CD, the amount of reduction between the first roughness and the first reduced roughness, the amount of reduction between the second CD and the second reduced CD, and/or the amount of reduction between the second roughness and the second reduced roughness may be adjusted to achieve optimal printing of the first and second patterns with reduced CD and reduced roughness.

In one embodiment, the second CD slimming process may be designed to achieve the second reduced CD in the second pattern, while minimally impacting the first reduced CD in the first pattern. For example, the first lithographic process and the second lithographic process may be performed to print a first CD and a second CD that are substantially or approximately equivalent. Thereafter, the first CD slimming process reduces the first CD to the first reduced CD, and the second CD slimming process reduces the second CD to the second reduced CD, while not impacting the first reduced CD, such that the first reduced CD and the second reduced CD are substantially or approximately equivalent.

In an alternate embodiment, the second CD slimming process may be designed to achieve reduction of both the first reduced CD and the second CD. For example, the first lithographic process and the second lithographic process may be performed to achieve a first CD and a second CD, wherein the first CD is printed larger than the second CD. Additionally, for example, the first CD may be printed up to about 5% larger than the second CD. Additionally, for example, the first CD may be printed up to about 10% larger than the second CD. Additionally, for example, the first CD may be printed up to about 15% larger than the second CD. Additionally, for example, the first CD may be printed up to about 25% larger than the second CD. Additionally, for example, the first CD may be printed about 25% to about 50% larger than the second CD. Additionally yet, for example, the first CD may be printed about 50% to about 75% larger than the second CD. Thereafter, the first CD slimming process reduces the first CD to the first reduced CD, and the second CD slimming process reduces the second CD to the second reduced CD, while further reducing the first reduced CD to a third reduced CD, such that the third reduced CD and the second reduced CD are substantially or approximately equivalent.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:
1. A method for patterning a substrate, comprising:
 forming a layer of radiation-sensitive material on a substrate;

preparing a pattern in said layer of radiation-sensitive material using a lithographic process, said pattern being characterized by a critical dimension (CD) and a roughness;

following said preparing said pattern, performing a CD slimming process to reduce said CD to a reduced CD; and performing a vapor smoothing process during said CD slimming process to reduce said roughness to a reduced roughness.

2. The method of claim 1, wherein said roughness includes a line edge roughness (LER), or a line width roughness (LWR), or both LER and LWR.

3. The method of claim 1, further comprising:
characterizing said roughness by determining a pre-smoothing roughness assessed immediately prior to said vapor smoothing process and determining a post-smoothing roughness assessed immediately following said vapor smoothing process; and
achieving a reduction in said roughness exceeding 10%, said reduction in said roughness measured as a percentile ratio of a difference between said pre-smoothing roughness and said post-smoothing roughness to said pre-smoothing roughness.

4. The method of claim 1, further comprising:
characterizing said roughness by determining a pre-smoothing roughness assessed immediately prior to said vapor smoothing process and determining a post-smoothing roughness assessed immediately following said vapor smoothing process; and
achieving a reduction in said roughness exceeding 30%, said reduction in said roughness measured as a percentile ratio of a difference between said pre-smoothing roughness and said post-smoothing roughness to said pre-smoothing roughness.

5. The method of claim 1, wherein said CD slimming process comprises:
dispensing a developing solution on said substrate, said developing solution heated to a hot develop temperature exceeding 30 degrees C.;
treating said substrate with a treatment compound containing an acid;
baking said substrate to diffuse said acid into said pattern; and
dispensing another developing solution on said substrate.

6. The method of claim 5, wherein said vapor smoothing process is performed following said dispensing said developing solution and preceding said treating said substrate.

7. The method of claim 5, wherein said vapor smoothing process is performed following said baking said substrate and preceding said dispensing said another developing solution.

8. The method of claim 1, further comprising:
following said performing said CD slimming process, performing one or more additional vapor smoothing processes to further reduce said reduced roughness to another reduced roughness.

9. The method of claim 1, further comprising:
freezing said pattern with said reduced CD in said layer of radiation-sensitive material using a freeze process;
forming a second layer of radiation-sensitive material on said pattern with said reduced CD in said layer of radiation-sensitive material;
preparing a second pattern in said second layer of radiation-sensitive material using a second lithographic process, said second pattern being characterized by a second CD and a second roughness;

following said preparing said second pattern, performing a second CD slimming process to reduce said second CD to a second reduced CD; and following said preparing said second pattern, performing a second vapor smoothing process to reduce said second roughness to a second reduced roughness.

10. The method of claim 9, wherein said layer of radiation-sensitive material comprises a thermally curable freeze resist, and wherein said freezing said pattern in said layer of radiation-sensitive material using said freeze process comprises baking said layer of radiation-sensitive material to thermally cure and preserve said pattern with said reduced CD.

11. The method of claim 10, wherein said layer of radiation-sensitive material comprises a chemically curable freeze resist, and wherein said freezing said pattern in said layer of radiation-sensitive material using said freeze process comprises:
applying a chemical freeze material over said layer of radiation-sensitive material;
reacting said chemical freeze material with said layer of radiation-sensitive material to chemically cure and preserve said pattern with said reduced CD in said layer of radiation-sensitive material; and
stripping said chemical freeze material.

12. The method of claim 11, further comprising:
utilizing said pattern in said layer of radiation-sensitive material as a mandrel for performing a sidewall image transfer process.

13. The method of claim 9, wherein said layer of radiation-sensitive material comprises an electromagnetic (EM) radiation curable freeze resist, and wherein said freezing said pattern in said layer of radiation-sensitive material using said freeze process comprises exposing said layer of radiation-sensitive material to EM radiation to radiatively cure and preserve said pattern with said reduced CD.

14. The method of claim 1, further comprising:
utilizing said pattern in said layer of radiation-sensitive material as a mandrel for performing a sidewall image transfer process.

15. The method of claim 1, wherein said layer of radiation-sensitive material comprises an EUV (extreme ultraviolet) resist.

16. The method of claim 1, wherein said performing said vapor smoothing process comprises:
exposing said pattern to a treatment vapor, said treatment vapor containing N-Methylpyrrolidone or N-Methyl-2-pyrrolidone.

17. The method of claim 16, wherein said performing said vapor smoothing process further comprises:
heating said substrate during said exposing of said pattern on said substrate to said treatment vapor.

18. The method of claim 16, wherein said performing said vapor smoothing process further comprises:
irradiating said substrate with electromagnetic (EM) radiation during said exposing of said pattern on said substrate to said treatment vapor.

19. The method of claim 18, wherein said performing said vapor smoothing process further comprises:
irradiating said substrate with at least one of ultraviolet (UV) radiation, infrared (IR) radiation, electron beam radiation, or microwave radiation, or any combination of two or more thereof.

20. The method of claim 1, wherein said CD slimming process comprises dispensing a first developing solution on said substrate, diffusing an acid-containing treatment compound into a surface region of said pattern; and dispensing a second developing solution on said substrate to remove said surface region, and wherein said vapor smoothing process is performed after dispensing said first developing solution and before dispensing said second developing solution.

* * * * *